United States Patent
Lee

(10) Patent No.: US 12,372,812 B2
(45) Date of Patent: Jul. 29, 2025

(54) THREE-DIMENSIONAL ELECTRONIC DEVICES AND METHODS OF PRODUCING THE SAME

(71) Applicant: Purdue Research Foundation, West Lafayette, IN (US)

(72) Inventor: Chi-Hwan Lee, West Lafayette, IN (US)

(73) Assignee: Purdue Research Foundation, West Lafayette, IN (US)

(*) Notice: Subject to any disclaimer, the term of this patent is extended or adjusted under 35 U.S.C. 154(b) by 112 days.

(21) Appl. No.: 18/006,418

(22) PCT Filed: Sep. 21, 2021

(86) PCT No.: PCT/US2021/051184
§ 371 (c)(1),
(2) Date: Jan. 23, 2023

(87) PCT Pub. No.: WO2022/061261
PCT Pub. Date: Mar. 24, 2022

(65) Prior Publication Data
US 2023/0288729 A1     Sep. 14, 2023

Related U.S. Application Data

(60) Provisional application No. 63/080,892, filed on Sep. 21, 2020.

(51) Int. Cl.
*H10F 39/12*     (2025.01)
*G02C 7/04*      (2006.01)
(Continued)

(52) U.S. Cl.
CPC .......... *G02C 7/049* (2013.01); *H10F 39/107* (2025.01); *H10F 77/413* (2025.01); *H10K 19/10* (2023.02)

(58) Field of Classification Search
CPC ............... G02C 7/049; H01L 27/1446; H01L 31/02327; H10K 19/10; Y02E 10/549
See application file for complete search history.

(56) References Cited

U.S. PATENT DOCUMENTS 8,894,201 B2    11/2014   Pugh et al.
2004/0027536 A1  2/2004   Blum et al.
(Continued)

FOREIGN PATENT DOCUMENTS

KR    2011-0048116 A    5/2011
WO    2012061411 A1     5/2012

OTHER PUBLICATIONS

International Report on Patentability for International Patent Application No. PCT/US2021/051184, dated Mar. 21, 2023, 7 pages.
(Continued)

*Primary Examiner* — Samuel Park
(74) *Attorney, Agent, or Firm* — Hartman Global IP Law; Gary M. Hartman; Domenica N. S. Hartman

(57) ABSTRACT

Electronic devices, methods of producing such electronic devices, and electronic contact lens devices as an example of such an electronic device. According to one aspect, a three-dimensional electronic device includes a fractal structure having an array with a plurality of radial members interconnected at and radially extending from a center of the device, and spiral members each encircling the center and any spiral members located radially inward therefrom.

9 Claims, 23 Drawing Sheets

(51) Int. Cl.
  *H10F 39/10* (2025.01)
  *H10F 77/40* (2025.01)
  *H10K 19/10* (2023.01)

(56) References Cited

U.S. PATENT DOCUMENTS

| | | |
|---|---|---|
| 2008/0151084 A1* | 6/2008 | Lu .................. H04N 25/702 |
| | | 348/E5.025 |
| 2014/0273316 A1 | 9/2014 | Pugh et al. |
| 2020/0038173 A1* | 2/2020 | Reedy .................. G02C 7/044 |

OTHER PUBLICATIONS

Lee, E.K. et al., "Fractal Web Design of a Hemispherical Photodetector Array with Organic-Dye-Sensitized Grapheanaae Hybrid Composites", Adv. Mater. 2020, 32, 9 pages.
Liu, L. et al., "Spider-Web Inspired Multi-Resolution Graphene Tactile Sensor", Chem. Commun., 2018, 54, 4 pages.
International Search Report and Written Opinion for International Application No. PCT/US2021/051184, dated Jan. 10, 2022, 12-pages.

* cited by examiner

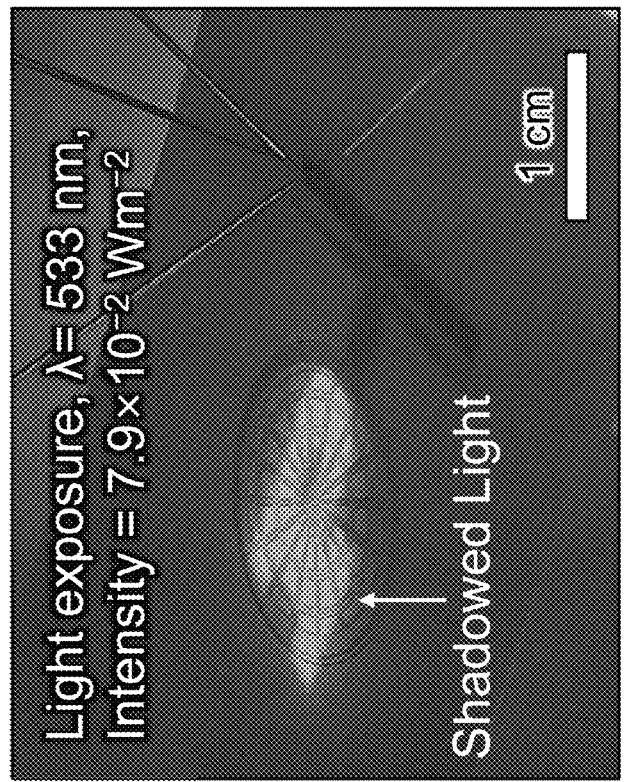
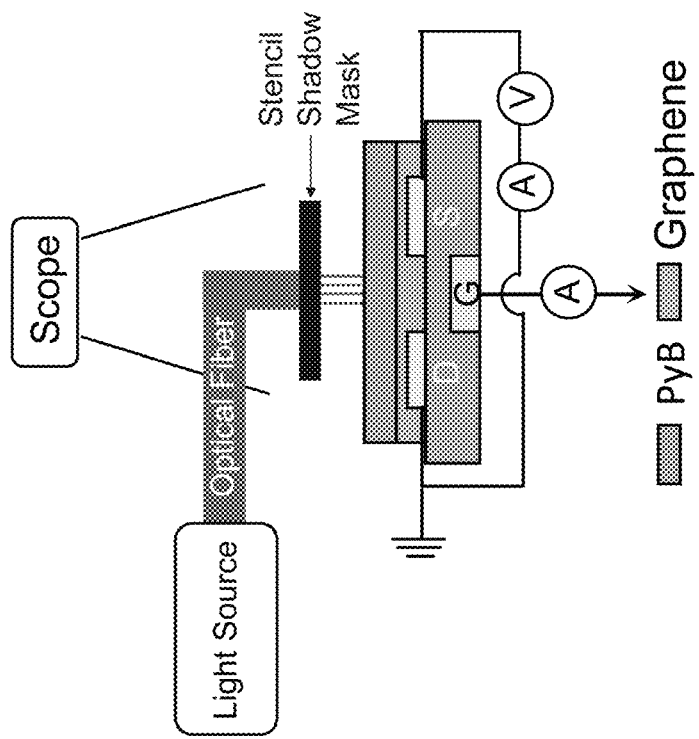
FIG. 3B
FIG. 3A

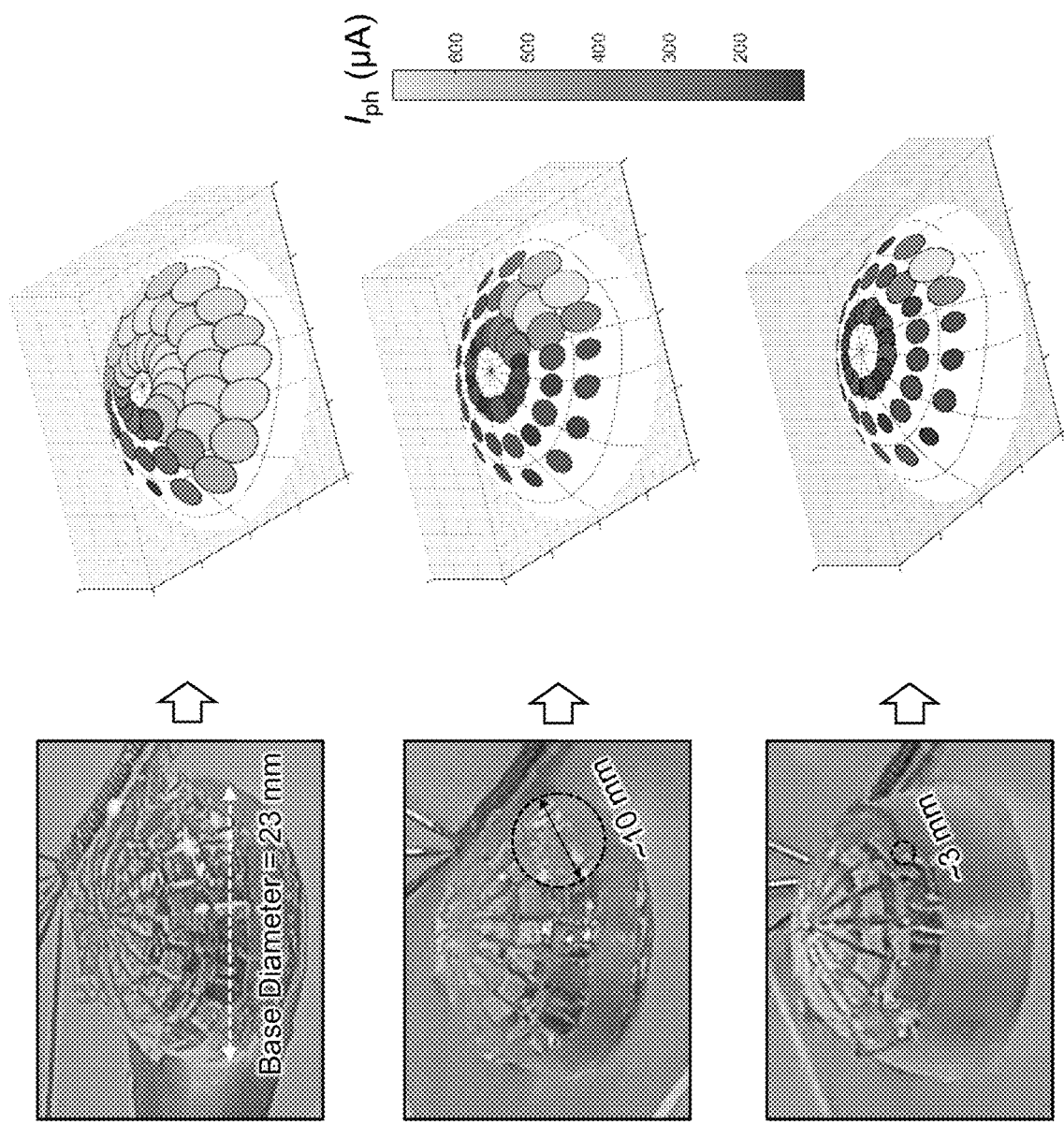

THREE-DIMENSIONAL ELECTRONIC DEVICES AND METHODS OF PRODUCING THE SAME

CROSS REFERENCE TO RELATED APPLICATIONS

This application claims priority to International Patent Application No. PCT/US2021/051184 filed Sep. 21, 2021, which claims the benefit of U.S. Provisional Application Nos. 63/080,892 filed Sep. 21, 2020. The contents of these prior patent documents are incorporated herein by reference.

STATEMENT REGARDING FEDERALLY SPONSORED RESEARCH

This invention was made with government support under Contract No. CMMI 1928784 awarded by the National Science Foundation. The Government has certain rights in the invention.

BACKGROUND OF THE INVENTION

The present invention generally relates to electronic devices. The invention particularly relates to three-dimensional electronic devices that have a fractal structure having an array with a plurality of interconnected radial members and spiral members applied to three-dimensional (3D) surfaces, time-dynamic surfaces, and/or flexible surfaces.

The structural architecture of spider webs found in nature have the potential to inspire the development of next-generation materials that are capable of efficiently resisting various mechanical loads from environments. The fractal web designs that exhibit a repeating pattern on all scale (self-similar) provide unique capabilities to (1) distribute externally-induced stress throughout the threads according to the effective ratio of spiral and radial dimensions; (2) provide greater extensibility to better dissipate force under stretching; and (3) tolerate minor cuts of the threads while maintaining overall strength and function of the entire web architecture. Recent studies have demonstrated spider web-inspired synthetic materials for which the fractal web designs provide an unusual combination of strength and elasticity while being virtually free of stress concentrations even with few cuts of the spiral threads. Although these principles have profound impacts on new design variables for multifunctional or/and multidimensional engineering, the fractal web designs are not well utilized in electronics yet due at least in part to the lack of necessary combination of advanced materials, mechanics designs, and system-level integration capabilities for practical application.

Optoelectronic materials and devices deployed across curvilinear surfaces offer qualitatively expanded levels of functionality enabling a large field of view with no aberration, resembling the compound-eye vision system of arthropods. These three-dimensional (3D) optoelectronic architectures are particularly attractive for photodetection systems that require a large field of view and wide-angle antireflection. To engineer a compound eye-mimicking system, the most promising procedures involve direct printing of photosensitive pixels on curved or hemispherical surfaces in a carefully-aligned manner. These efforts pave the way for realizing various 3D forms of photodetectors, but progress in this area is impeded by the complexity of assembling high-performance optoelectronic devices and components onto non-planar surfaces at the microscale and matching the shape of photodetector array with the fixed curvature. Furthermore, these approaches primarily use Si-based photodetectors, while leaving opportunities to explore zero-bandgap materials, such as graphene, for a faster and wider range of spectral responses.

Graphene, due to its superior carrier mobility and atomically thin nature, provides unmatched optoelectronic properties that offer constant optical absorption coefficient from visible to infrared wavelengths. In addition, the excellent mechanical flexibility of graphene warrants its implementation into complex 3D architectures such as controllably-buckled or crumpled thin films, springs, and hinges. However, the photosensitivity of graphene is limited by the atomically thin body that allows absorbing light only as low as 2.3% over a wide spectral range. This material limitation impedes its practical application in photodetector systems.

In view of the above, it can be appreciated that there is ongoing interest in 3D electronic devices, and that it would be desirable if devices were available that were capable of at least partly overcoming or avoiding the problems, shortcomings or disadvantages noted above, as well as systems and methods for producing such devices.

BRIEF DESCRIPTION OF THE INVENTION

The present invention provides electronic devices that are capable of accommodating applied mechanical strain while maintaining operation of the electronic devices, provides methods of producing such an electronic device, and provides electronic contact lens devices as a particular but nonlimiting example of such an electronic device.

According to one aspect of the invention, a three-dimensional electronic device is provided that includes a fractal structure having an array with a plurality of radial members interconnected at and radially extending from a center of the device, and spiral members each encircling the center and any spiral members located radially inward therefrom.

According to another aspect of the invention, a method is provided for producing a three-dimensional electronic device. The method includes depositing a supporting layer on a substrate, depositing and photolithographically patterning gate electrodes and source/drain electrodes on the supporting layer to define an active area, forming an n-type doped graphene layer on the active area to define a photoactive area, depositing an additional support layer over the gate electrodes, the source/drain electrodes, and the n-type doped graphene layer, etching away portions of the additional support layer to form a fractal structure having an array with a plurality of radial members interconnected at and radially extending from a center, spiral members each encircling the center and any spiral members located radially inward therefrom, and patterned portions of the n-type doped graphene layer at cross-junctions of the spiral and radial members, depositing a protective layer on at least the radial members of the array, and transferring the fractal structure onto a three-dimensional surface to yield the three-dimensional electronic device.

According to another aspect of the invention, an electronic contact lens device comprises a fractal structure having an array with a plurality of radial members interconnected at and radially extending from a center of the lens, spiral members each encircling the center and any spiral members located radially inward therefrom, and photodetectors at cross-junctions of the spiral and radial members.

Technical effects of three-dimensional electronic devices, methods, and electronic contact lens devices as described above include the capability to provide three-dimensional electronic devices with improved resistance to mechanical deformations, improved mechanical adaptability, and improved damage tolerance due to their fractal structures.

Other aspects and advantages of this invention will be appreciated from the following detailed description.

BRIEF DESCRIPTION OF THE DRAWINGS

FIG. 1A includes a schematic illustration of a photodetector array device fabricated on a substrate and then transferred to a transparent hemispherical dome to yield the three-dimensional (hemispherical) electronic (photodetector) device. FIG. 1B is a scanned image of a three-dimensional electronic device comprising a photodetector array device on a transparent hemispherical dome having a base diameter of 15 mm FIG. 1C is a schematic illustration of the structural layout of a fractal (web) structure of the photodetector array device of FIGS. 1A and 1B, and further includes an inset that represents a cross-sectional side view of a single pixel photodetector of the photodetector array device and shows the single pixel photodetector as containing a graphene hybrid composite comprising a graphene layer ("Graphene") and an n-type dopant ("PyB"). FIG. 1D is a scanned image of a microscope image of the single pixel photodetector. FIG. 1E contains two enlarged schematic illustrations of the single pixel photodetector (left) and serpentine traces of gold (Au) interconnects (right). FIG. 1F represents finite element analysis (FEA) results of a single radial thread a single pixel photodetector undergoing stretching.

FIGS. 2A and 2B represent experimental and FEA results of the transfer and output curves of the photodetector array device when placed on a flat surface, respectively. FIG. 2C represents experimental and FEA results of the corresponding transfer curves as a function of the light wavelength ranging from 440 nm to 700 nm. FIG. 2D represents photoresponsivity (R) versus source-gate voltage ($V_{GS}$). FIG. 2E represented measured absorption spectrum of Pyronin B (PyB) (black line) and the corresponding photocurrent (blue dots) as a function of the light wavelength ranging from 440 nm to 700 nm. FIG. 2F represents experimental and FEA results of the corresponding transfer curves as a function of the doping concentration of the n-type dopant (PyB) in graphene layers ranging from 1 µM to 1 mM. FIG. 2G represents dynamic photoresponsiveness of the photodetector. FIG. 2H represents extracted rising and decay time of the photodetector from FIG. 2G.

FIGS. 3A through 3F represent two-dimensional (2D) photocurrent mapping of a photodetector array device of FIGS. 1A through 1F. FIG. 3A includes a schematic illustration of the measurement setup. FIG. 3B includes a scanned image of a photograph of the measurement specimen with a stencil shadow mask with a pre-defined pattern (the letter "P"). FIGS. 3C-3F represent results of the 2D photocurrent mapping using stencil shadow masks of different patterns such as "P," cross, triangle, and heart symbol, respectively.

FIGS. 4A through 4D represent 3D photocurrent mapping of a three-dimensional electronic device of FIGS. 1A through 1F. FIG. 4A is a schematic illustration of the measurement setup. FIG. 4B includes a scanned image of a representative photograph (left column) and photocurrent mapping results (right column) when the entire area of the photodetector array device was illuminated. FIGS. 4C and 4D represent the corresponding results by focusing the laser beam onto specific sub-areas of the photodetector array device with the spot size of approximately 10 mm and 3 mm in diameter, respectively.

DETAILED DESCRIPTION OF THE INVENTION

Figure 1A:
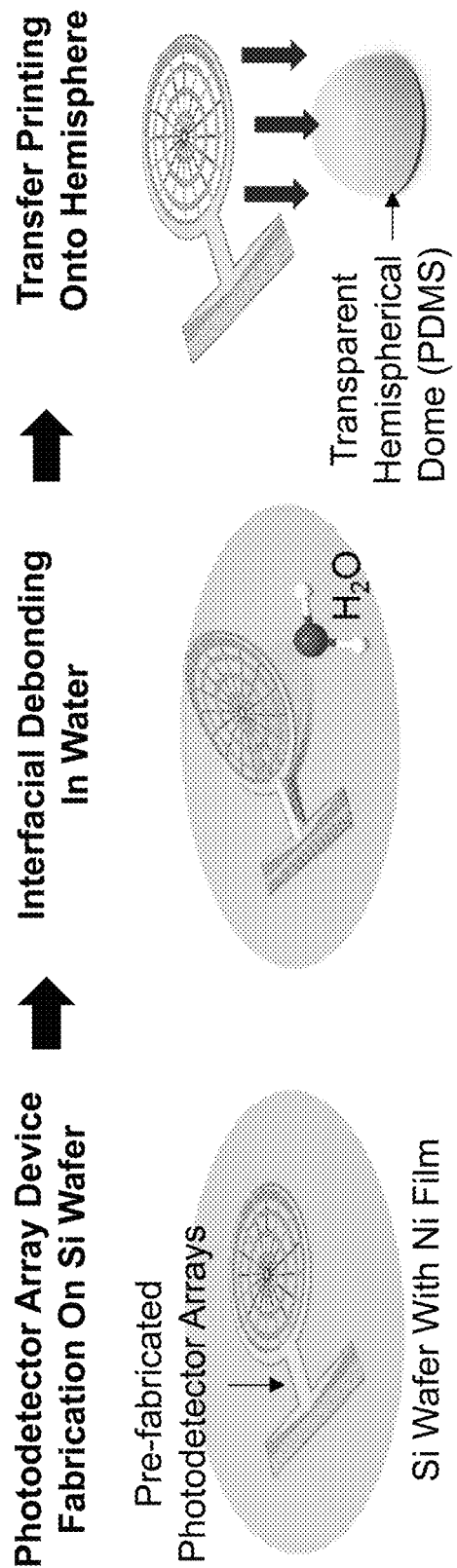
FIGS. 1A through 1F depict a fabrication method to yield a three-dimensional electronic device (FIG. 1B) in accordance with certain nonlimiting aspects of the invention.

The intended purpose of the following detailed description of the invention and the phraseology and terminology employed therein is to describe what is shown in the drawings, which include the depiction of one or more nonlimiting embodiments of the invention, and to describe certain but not all aspects of what is depicted in the drawings, including the embodiment(s) depicted in the drawings. The following detailed description also describes certain investigations relating to the embodiment(s) depicted in the drawings, and identifies certain but not all alternatives of the embodiment(s) depicted in the drawings.

Disclosed herein are three-dimensional electronic devices, photodetector array devices and other components or structures thereof, and methods for producing the same. The teachings described herein are applicable to various electronic devices capable of exhibiting improved resistance to mechanical deformations, improved mechanical adaptability, and improved damage tolerance due to having web-like fractal structures. Such structures may be particularly suitable for applications such as electronics having three-dimensional (3D) surfaces, time-dynamic surfaces, and/or flexible surfaces. A particular but nonlimiting exemplary application includes electronic contact lens devices, that due at least in part to the fractal structures of the photodetector array devices, are able to efficiently accommodate induced mechanical strains during the fabrication process and the natural behaviors of users such as blinking, rubbing, pressing, and/or scratching. In such an application, a three-dimensional electronic device as described herein can be shaped as a lens and made sufficiently pliable to be placed directly on the surface of an eye to operate as a smart soft contact lens, or a photodetector array device as described herein may be configured for direct placement on the eye surface to operate as a smart soft contact lens.

For convenience, nonlimiting aspects of the invention will now be described in reference to experimental investigations leading up to the invention. In particular, these investigations included producing and testing three-dimensional electronic deviced comprising a photodetector array device having a spider web-inspired fractal structure that included a hybrid composite material, with a focused application in high-performance 3D photodetection. In the nonlimiting experiments described below, the three-dimensional electronic devices had hemispherical shapes and the hybrid composite materials were composed of chemical vapor deposition (CVD)-grown graphene doped with an n-type dopant to attain enhanced optical light absorption along with desired mechanical flexibility and optoelectronic performances. In the experiments, the n-type dopant was the organic salt Pyronin B (PyB), a well-known water-soluble cationic dye. It should be understood that the fractal structures of the types described herein are applicable to other applications, such as but not limited to those noted herein. Furthermore, it is foreseeable that hybrid composite materials used to construct the fractal structures could be formed of doped organic materials other than those disclosed herein.

Even though the mechanical properties of fractal web architectures have been studied by few groups, very few attempts have been made for empirical, numerical, or analytical modeling of an orb spider web design under small and large deformations except for smaller order spider web honeycombs. It was determined during the investigations leading to the present invention that curiously satisfactory combinations of specific stiffness and strengths can be simultaneously realized by the hierarchical organization of higher-order fractal structures. In addition to better stiffness of the fractal structure than regular spider web honeycomb, the resulting architecture was unaffected even if few spiral threads are broken.

Figure 1B:
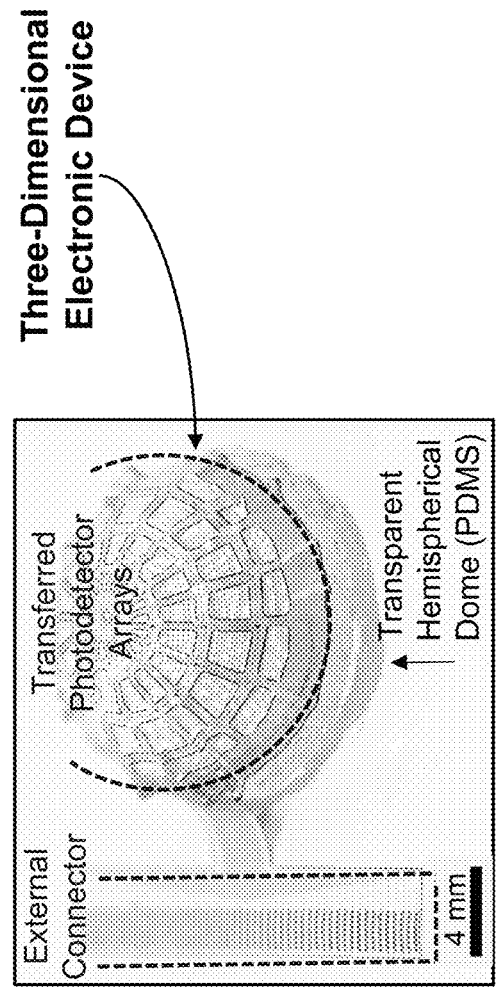

As represented in FIG. 1A, the photodetector array device was fabricated on planar silicon (Si) wafers using traditional microfabrication methods, followed by its deterministic assembly with various sizes of three-dimensional surfaces through a wet transfer printing technique to yield three-dimensional electronic devices, such as represented in FIG. 1B. The overall layout of the photodetector array device was shaped into a form that mimicked a planar orb web of garden spiders (e.g., Araneus diadematus) for which it effectively adopted the mechanical mismatch during its integration across the hemispherical surface. Comprehensive experimental and computational studies were conducted to reveal the underlying mechanical and optoelectrical properties of a three-dimensional electronic device, followed by a system-level demonstration to evaluate its performance on simultaneous detection of both direction and intensity of incident light.

Figure 5:
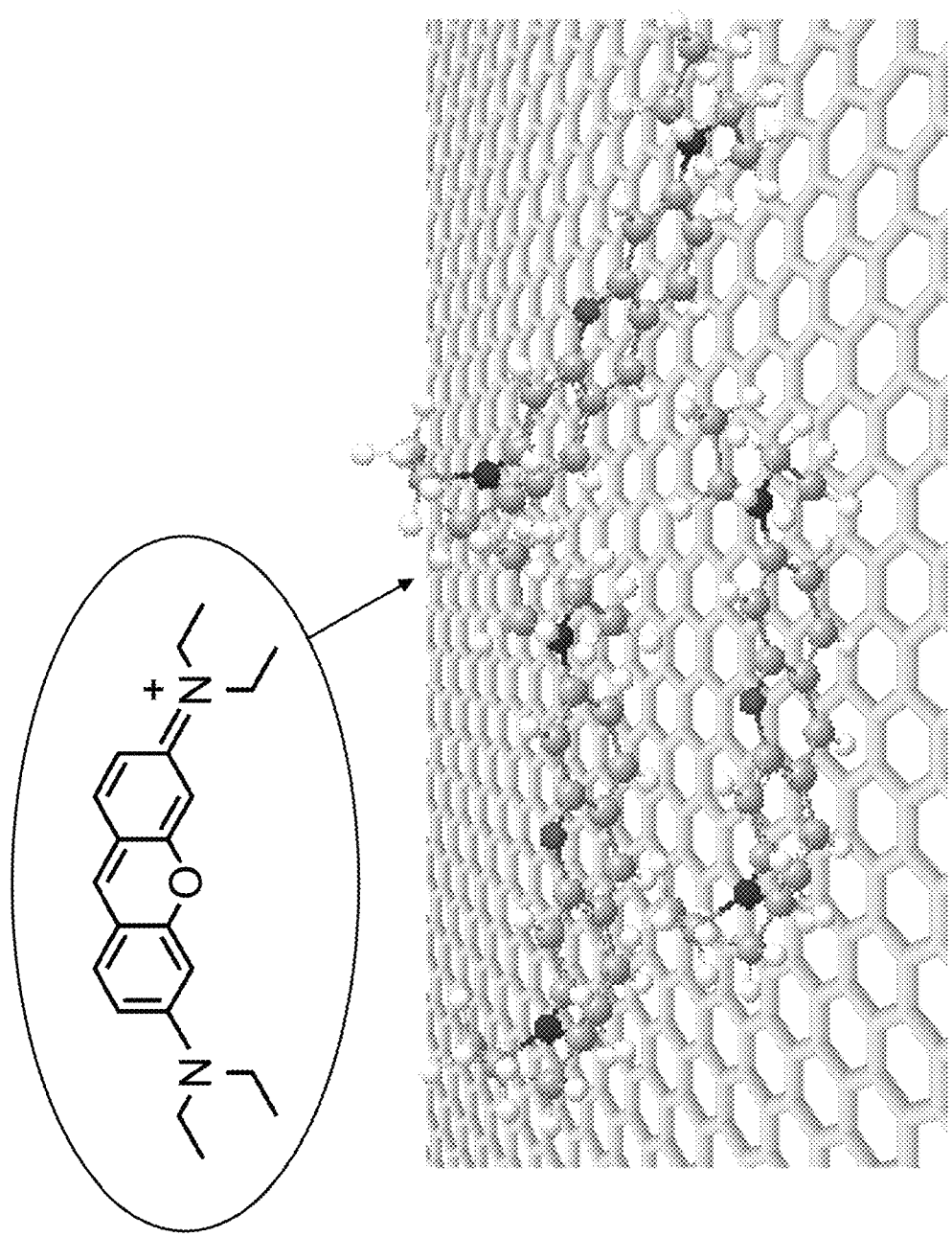
FIG. 5 schematically represents the adsorption mechanism (π-π interaction) of PyB in graphene.

The fabrication of the photodetector array device began with a Si wafer coated with thin films of Ni (100 nm-thick) and polyimide (PI, 3 µm-thick) to serve as a separation layer and a supporting layer, respectively. The fabrication of the resulting photodetector array device was then completed through sequential deposition and patterning of an epoxy-based negative photoresist (e.g., SU-8), a Pyronin B (PyB)-doped graphene sheet, a dielectric layer (e.g., $Al_2O_3$), and metal electrodes (e.g., Pd and Au) on top of the polyimide layer to yield the photodetector array device, as represented in the far left image of FIG. 1A. The mole concentrations of PyB were adjusted within a range from 1 µM to 1 mM in water to form strong π-π interactions with graphene and thereby enhance optical light absorptions (FIG. 5).

Figure 6:
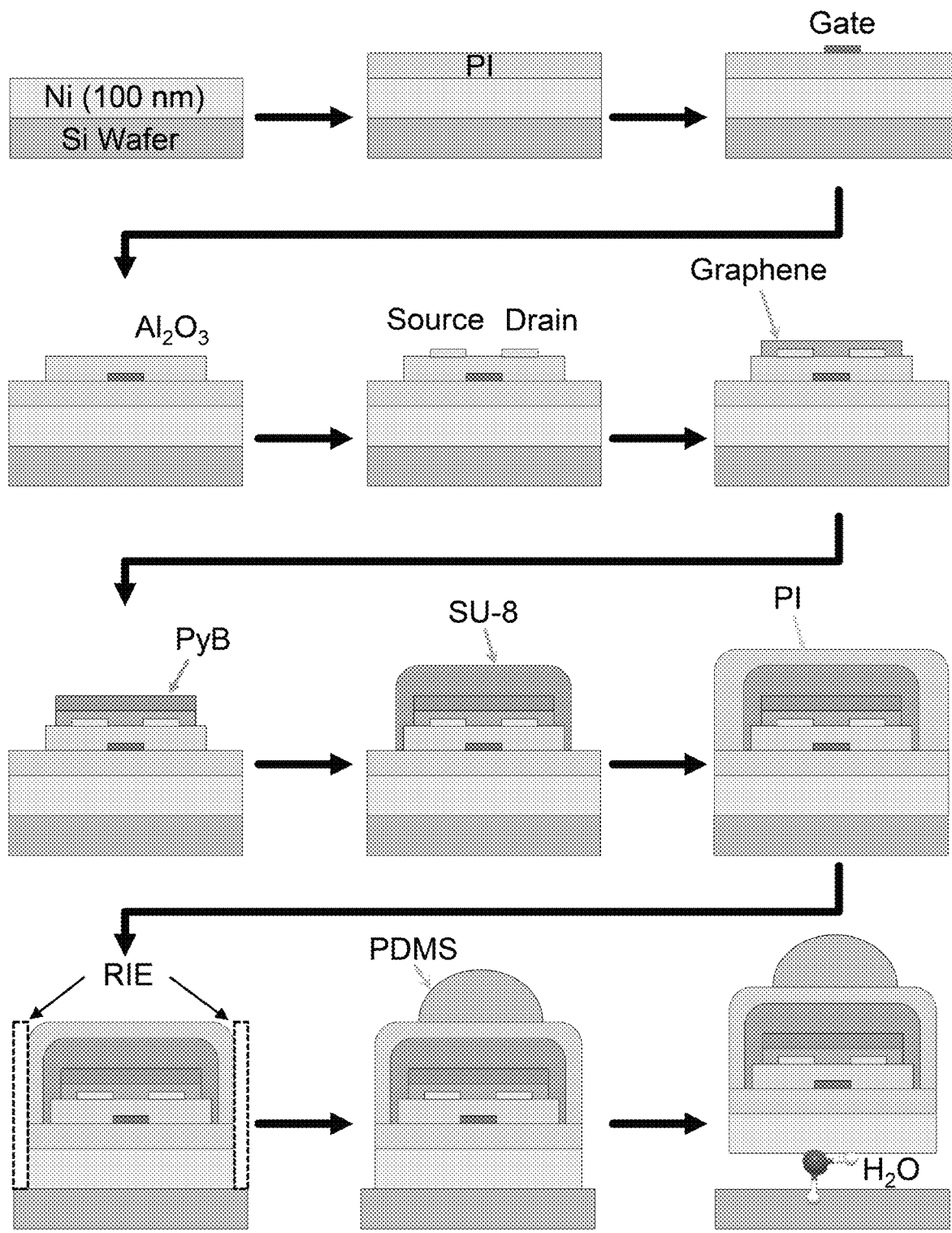
FIG. 6 is a schematic illustration of a fabrication procedure used to produce a three-dimensional (hemispherical) electronic device of a type represented in FIGS. 1A through 1F.

The photodetector array device was fabricated to have a plurality of "radial" members (threads) interconnected at and radially extending from a center of the device, and "spiral" members (threads) each encircling the center and any spiral threads located radially inward therefrom, as seen in FIG. 1A. Next, the surfaces of the radial threads were selectively capped with a transparent elastomer such as polydimethylsiloxane (PDMS) as a protective capping layer. The entire structure was then immersed in distilled (DI) water at room temperature and gently peeled from the Si wafer using a thermal release tape (Nitto Denko), which resulted in a clean separation of the Ni interlayer from the Si wafer (middle image of FIG. 1A). This interfacial debonding in water was attributed to the coupling of elasto-plastic deformation of adherent thin films and electrostatic reactions with water molecules at the debonding interface. Finally, the thermal release tape was removed by applying heat at 80° C. for three minutes, followed by transferring the resulting photodetector array device onto three-dimensional surface, which in the experiments was the surface of a transparent hemispherical dome that was molded with PDMS (far right image of FIG. 1A). Further details of the fabrication procedure are schematically illustrated in FIG. 6.

Figure 1C:
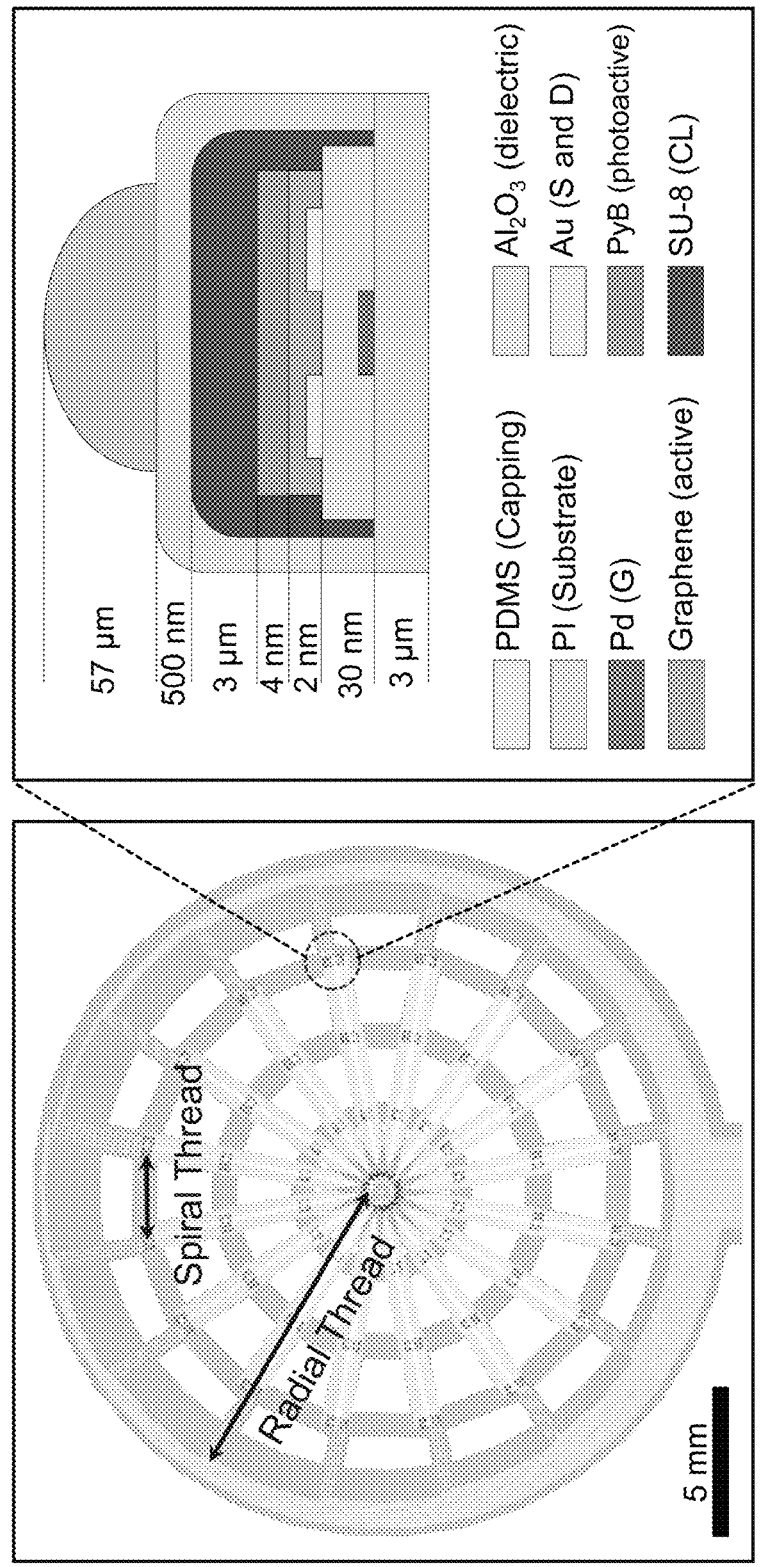
Figure 1D:
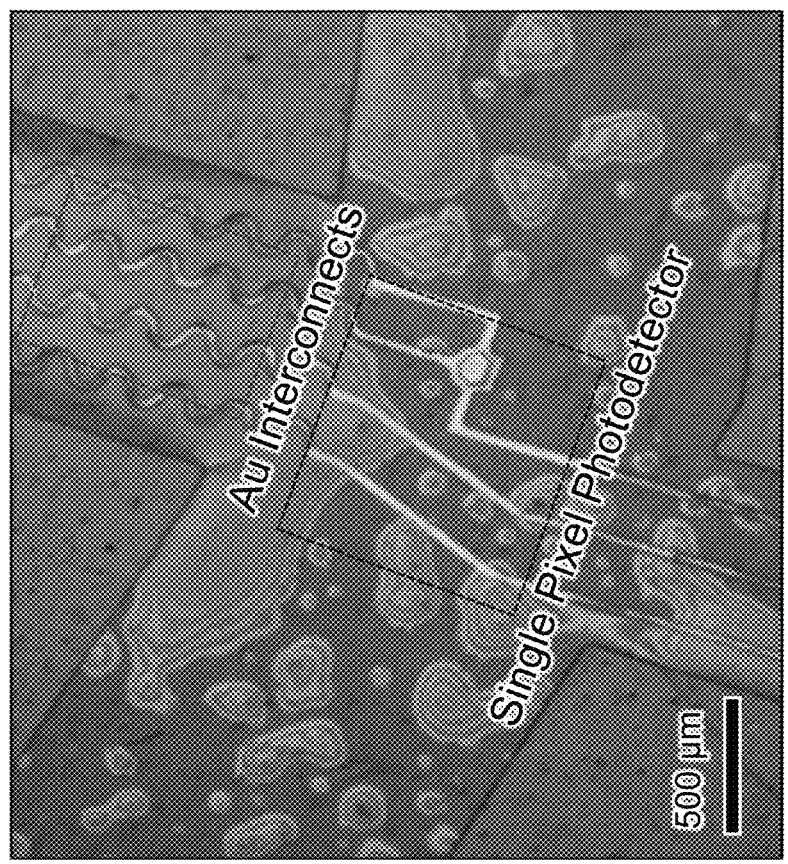
Figure 1E:
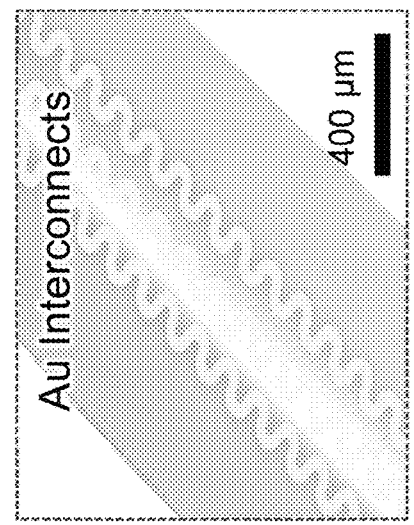
Figure 1E:
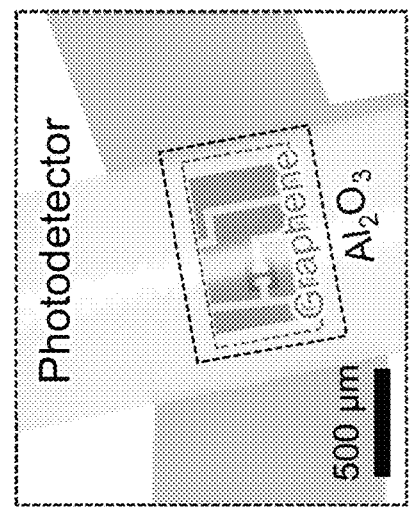
Figure 1F:
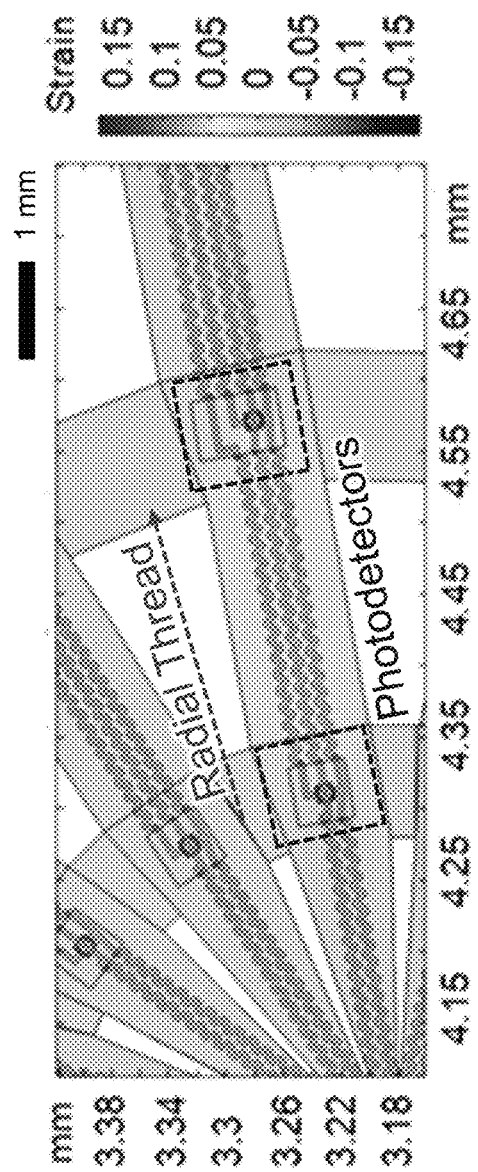
Figure 7:
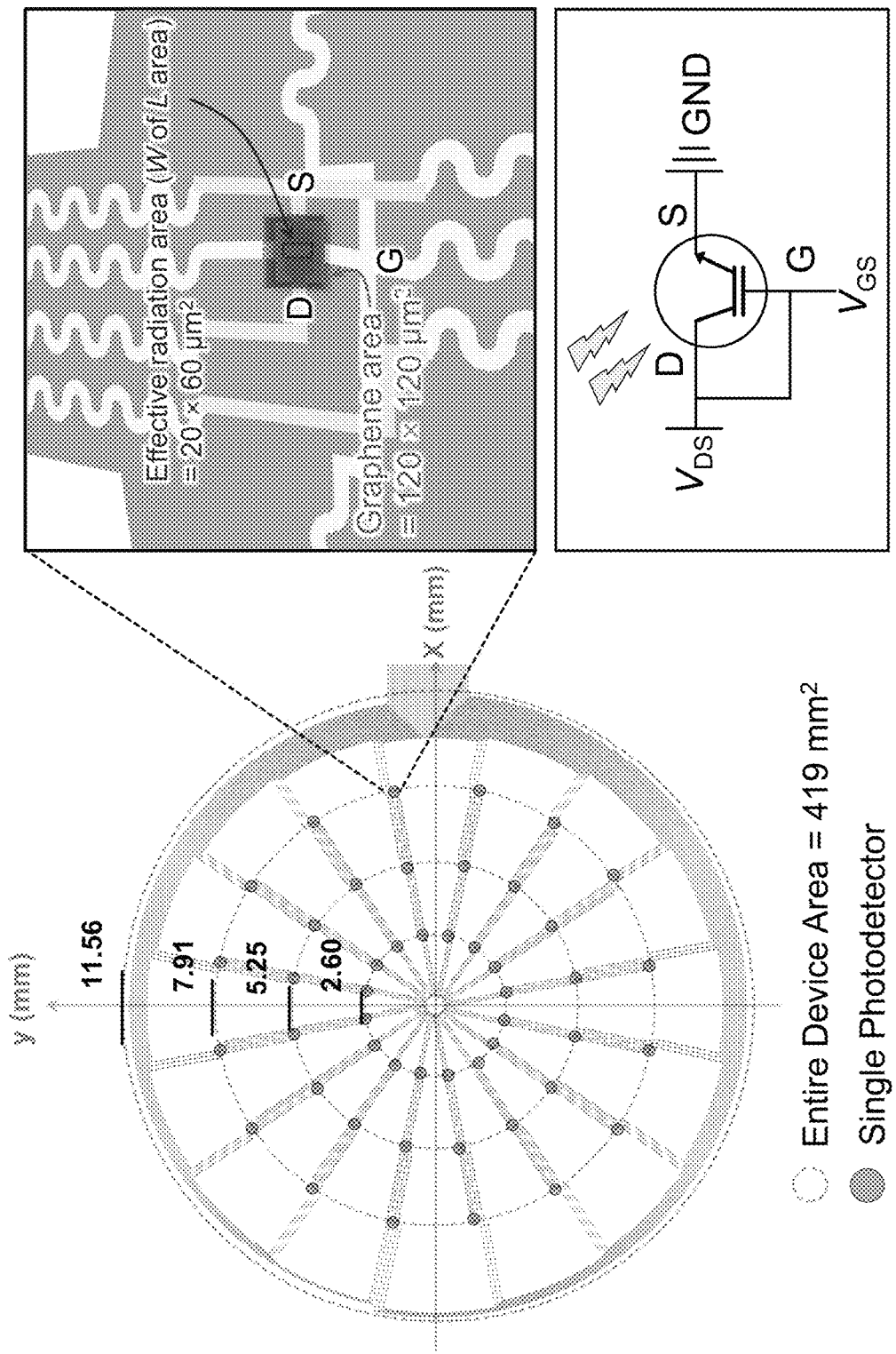
FIG. 7 includes a schematic illustration for the geometric information and equivalent circuit diagram of a photodetector array device.
Figure 8:
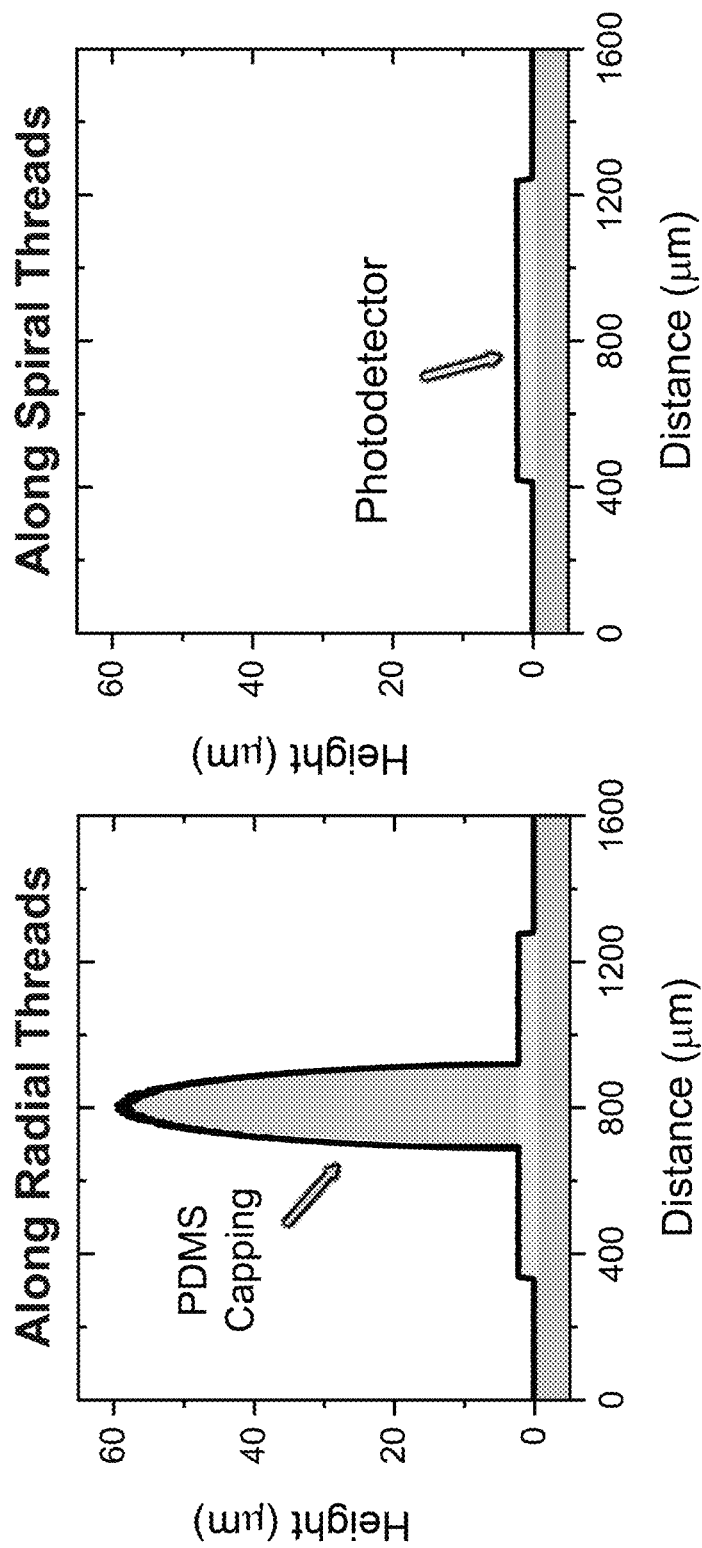
FIG. 8 represents results of alpha-step measurements along the radial (left) and spiral (right) threads of a photodetector array device.
Figure 9:
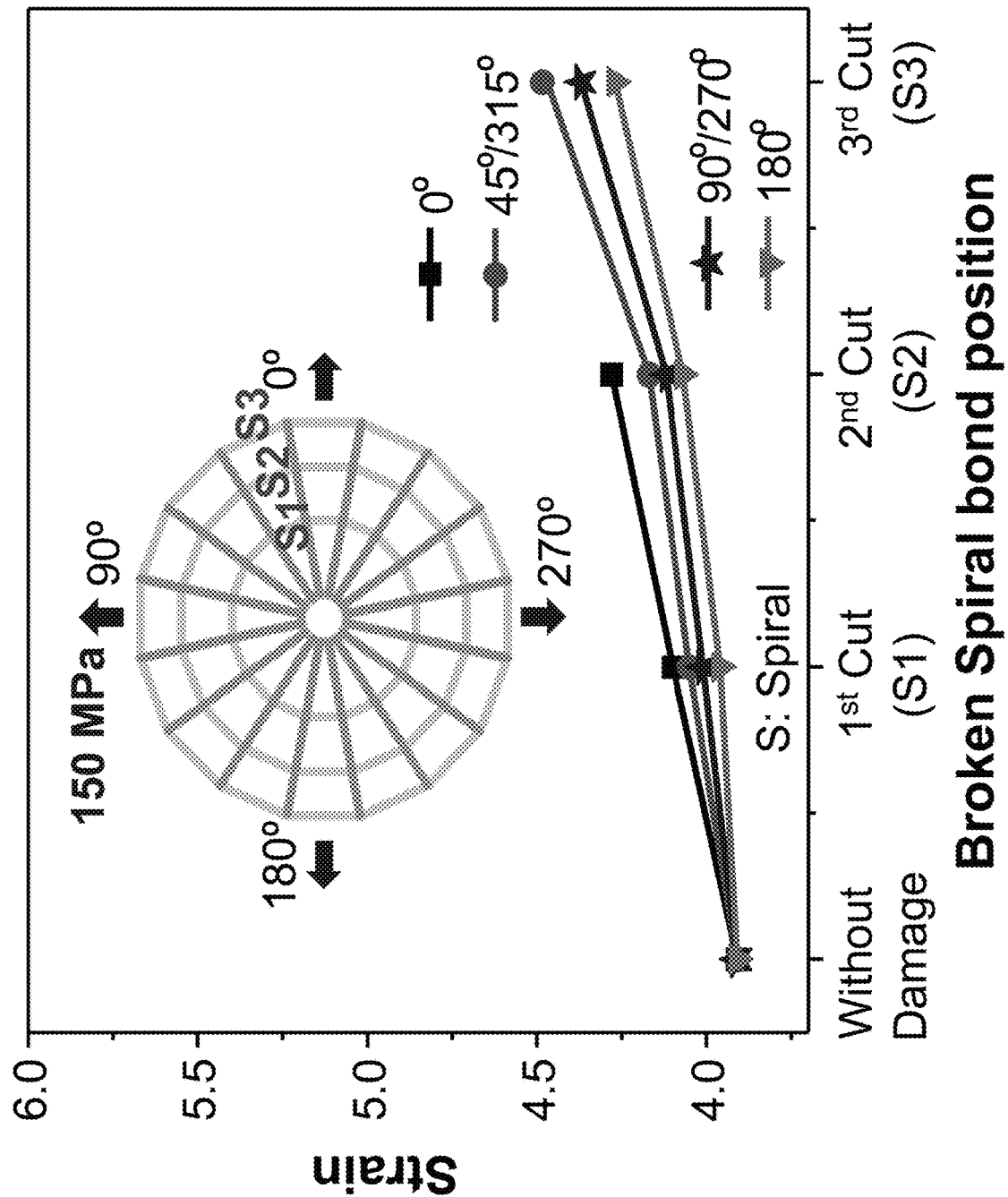
FIG. 9 represents results of reliability tests for the fractal structure with minor damages (up to 3 cuts; marked as S1, S2, and S3) along a spiral thread with respect to the force direction (150 MPa) at 0°, 45°/315°, 90°/270°, and 180°.

FIG. 1B shows a representative photograph of the photodetector array device placed on a transparent hemispherical dome (PDMS) with a base diameter of 15 mm to yield a three-dimensional (hemispherical) electronic (photodetector) device. The fractal (web) structure of the photodetector array device allowed its nearly seamless integration across the hemispherical surface of the dome while a few wrinkles were formed on the edge in order to adopt the difference in overall size. The mechanical robustness of the photodetector array device allowed it to be detached from and reattached to various sizes of transparent hemispherical domes with a base diameter ranging from 15 mm to 31 mm without generating damage. FIG. 1C schematically illustrates the overall structural layout of a fractal (web) structure that contains a total of 48-pixel photodetectors at the cross-junctions of the spiral and radial threads. A detailed representation showing the locations of individual photodetectors of a photodetector array device is provided in FIG. 7. The inset of FIG. 7 provides certain geometric information of a single pixel photodetector. FIG. 7 also contains the equivalent circuit diagram of a single pixel photodetector. As noted above, the inset of FIG. 1C presents a cross-sectional side view of a single pixel photodetector of the photodetector array device, displaying the constituent materials with their experimental thicknesses and functions. FIGS. 1D and 1E provide a microscope image and an enlarged schematic to highlight a single pixel photodetector and its serpentine traces of Au interconnects, respectively. Both the photodetectors and Au interconnects were positioned along the radial threads wherein the relatively thick PDMS capping layer (about 57 μm-thick; FIG. 8) provided mechanical protection, allowing the radial threads to experience strains of less than 4% under stretching (FIG. 1F). This configuration also allowed externally-induced forces to be selectively distributed along the spiral and radial threads with the ratio of approximately 7 to 1, while maintaining its overall strength and function even with minor cuts of the spiral threads (FIG. 9).

Figure 10A:
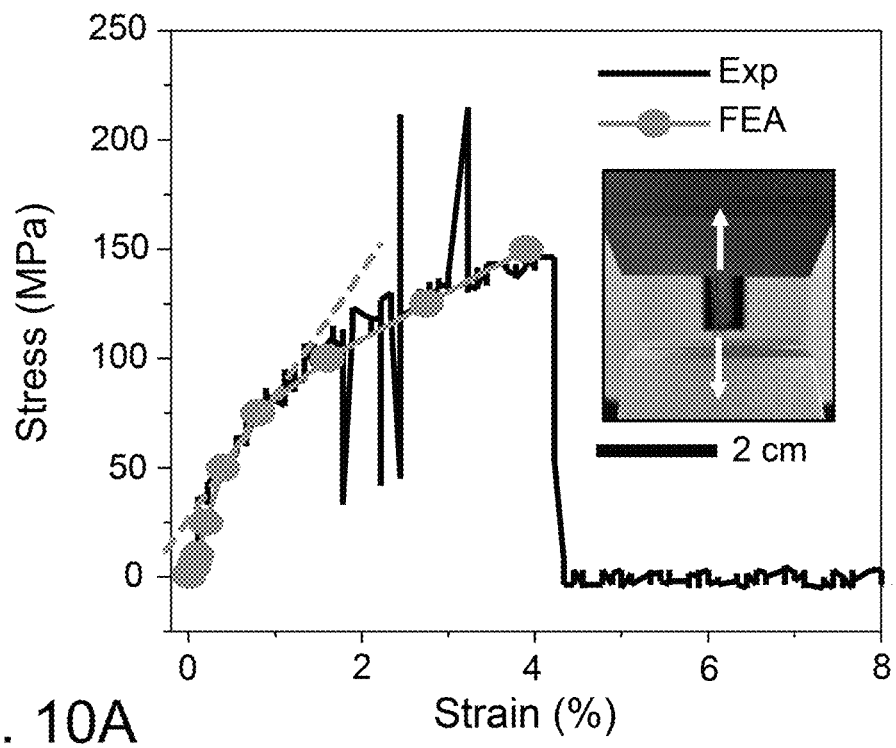
FIGS. 10A and 10B represent experimental and FEA results showing the nonlinear stress-strain relationships of the radial threads of a photodetector array device under stretching prior to fracture at the stress of 150 MPa, and FEA results of the maximum strain tolerance of the constituent materials (e.g., graphene, $Al_2O_3$ layer, metal electrodes, and polyimide) of the photodetector array device as a function of the base diameter ranging from 15 mm to 31 mm under the stress of 15 MPa, respectively.
Figure 10B:
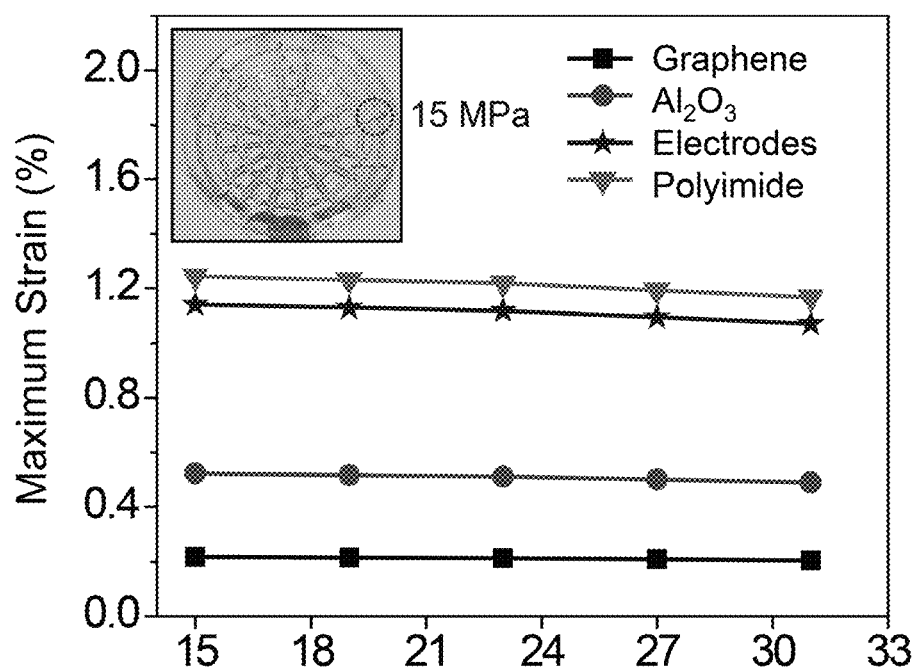

Experimental and FEA results in FIG. 10A show the nonlinear stress-strain relationships of the radial threads under stretching prior to fracture at a stress of 150 MPa. The radial threads showed a nearly viscoelastic behavior such that they resisted strains at the beginning of stretching but then had nearly linear stress-strain relationships thereafter. Here, the initial nonlinearity appeared mainly because of the viscoelastic property of the polyimide layer in combination with materials of relatively high Young's modulus (E) such as $Al_2O_3$ (E=300 GPa), graphene (E=1.02 TPa), and metal thin films (E>60 GPa) that enhanced mechanical robustness. FIG. 10B presents the maximum strain tolerance of these materials by comparison with the polyimide layer when placed on hemispherical PDMS domes with a base diameter ranging from 15 mm to 31 mm under the stress of 15 MPa. The maximum strain of these materials decreased negligibly with increased base diameters while the polyimide layer adopted more strains during their integration because of its substantially lower mechanical modulus than the rest of the material layers.

Figure 2B:
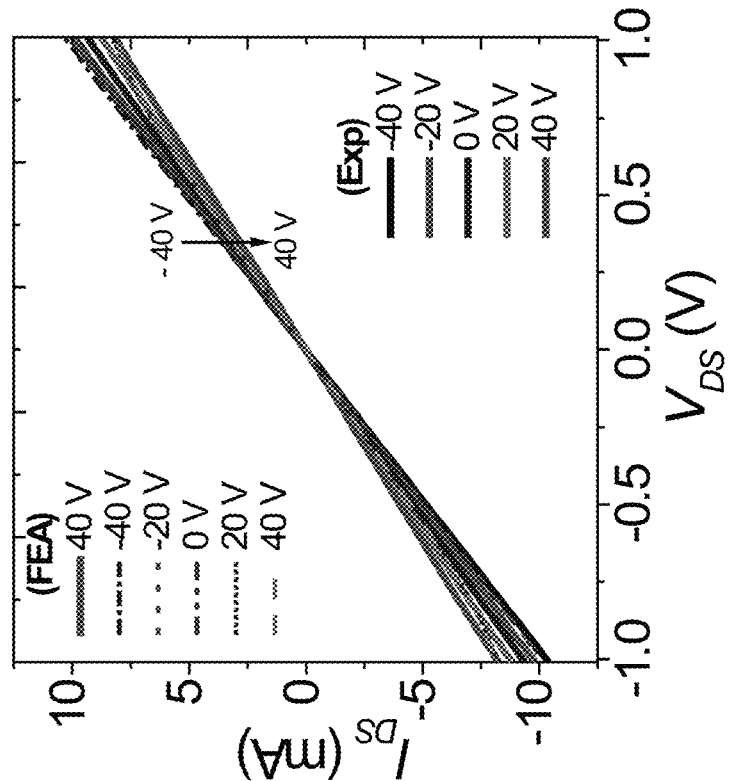
FIGS. 2A through 2H contain plots representing electrical and optoelectrical characterizations of a photodetector array device of FIGS. 1A through 1F.
Figure 2A:
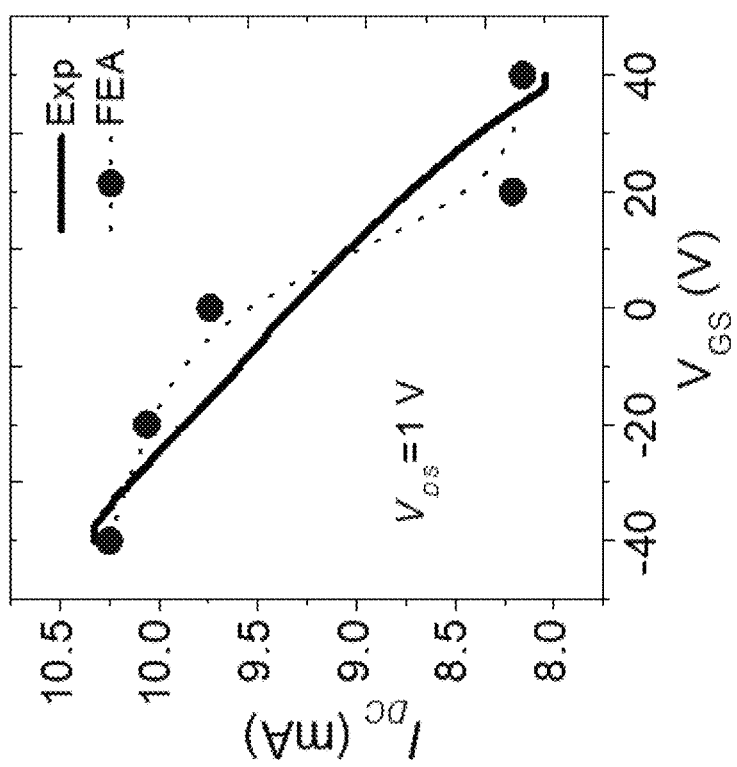
Figure 2C:
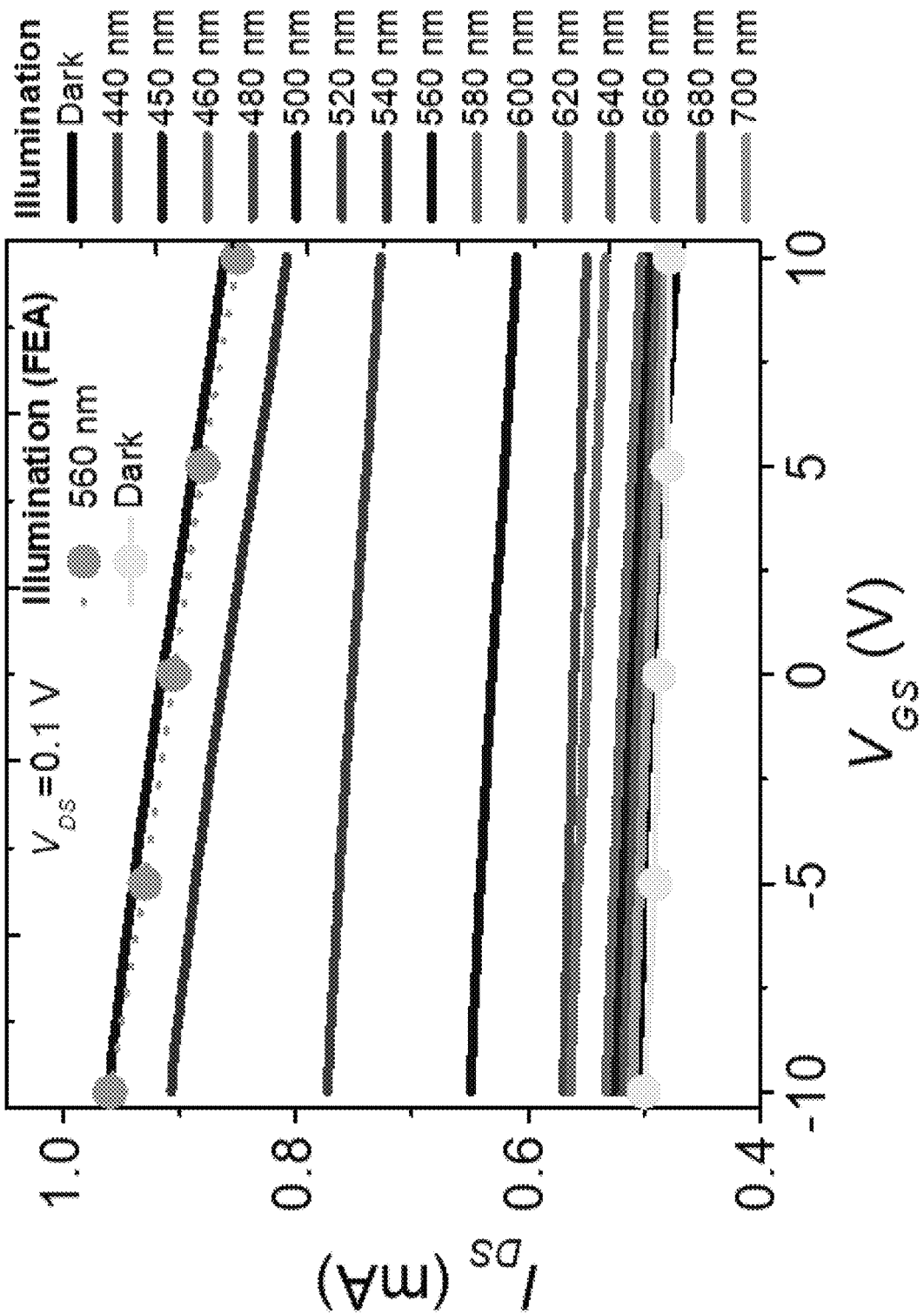
Figure 2E:
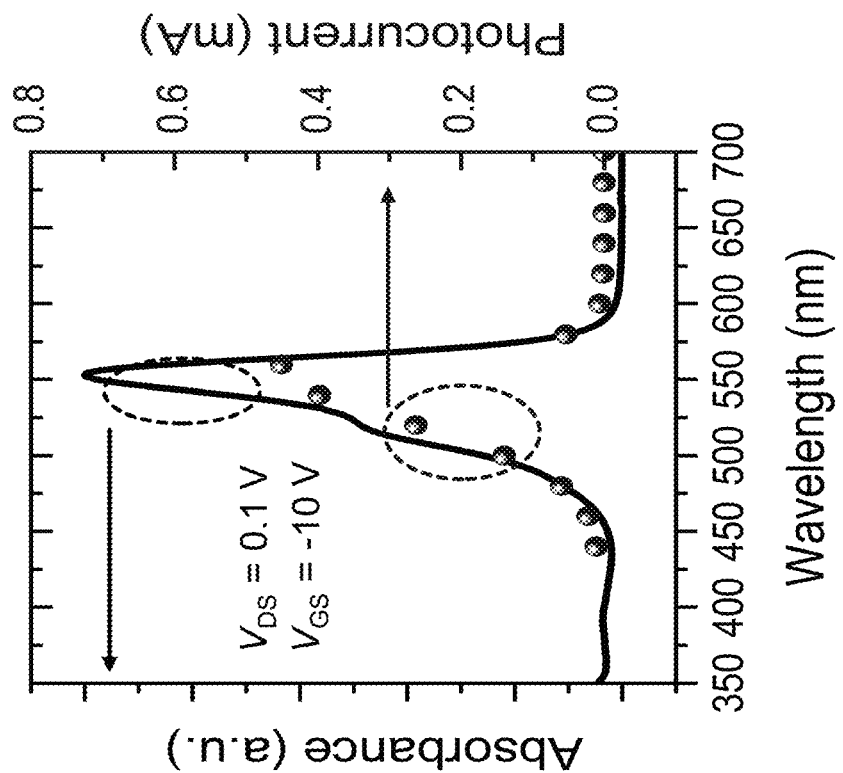
Figure 2D:
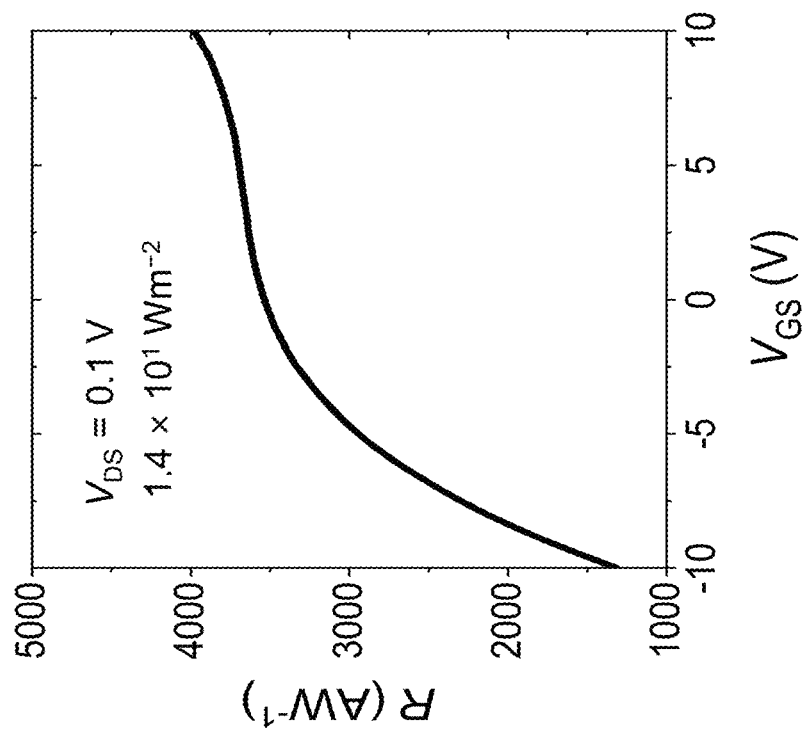
Figure 2F:
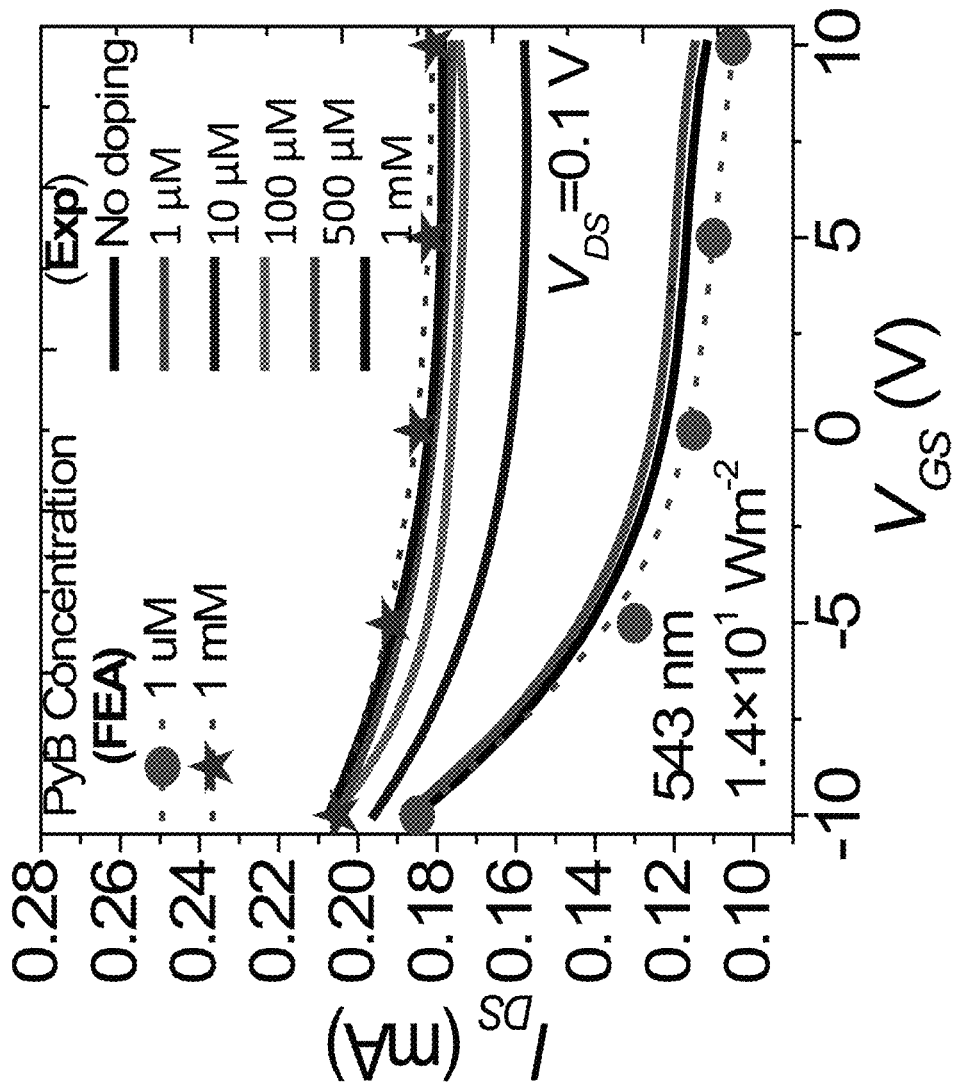
Figure 2H:
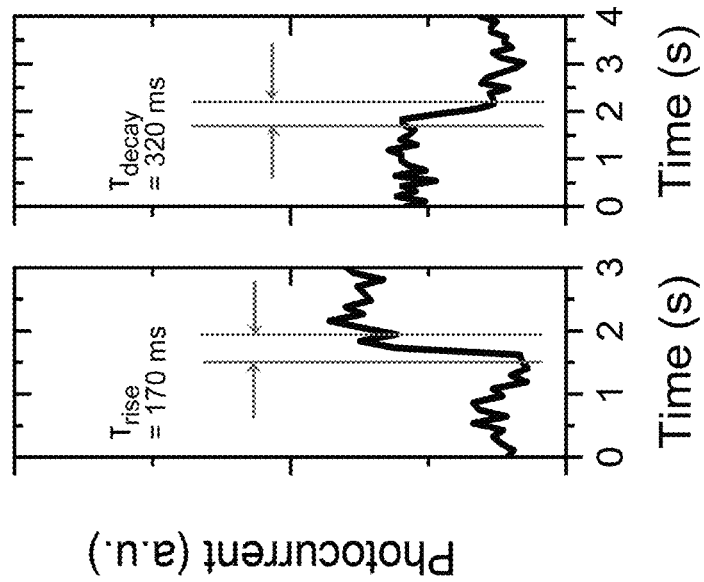
Figure 2G:
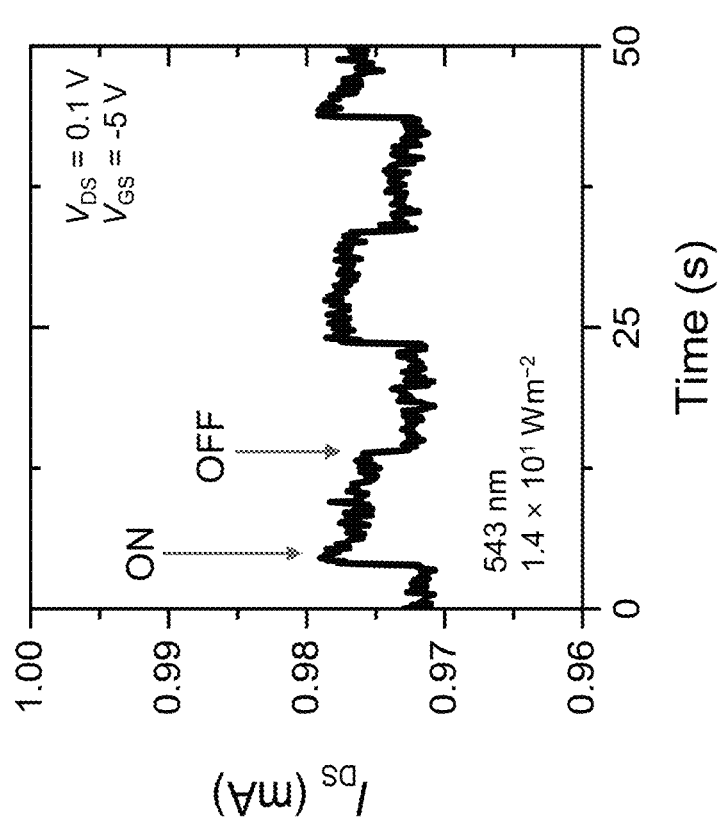
Figure 11:
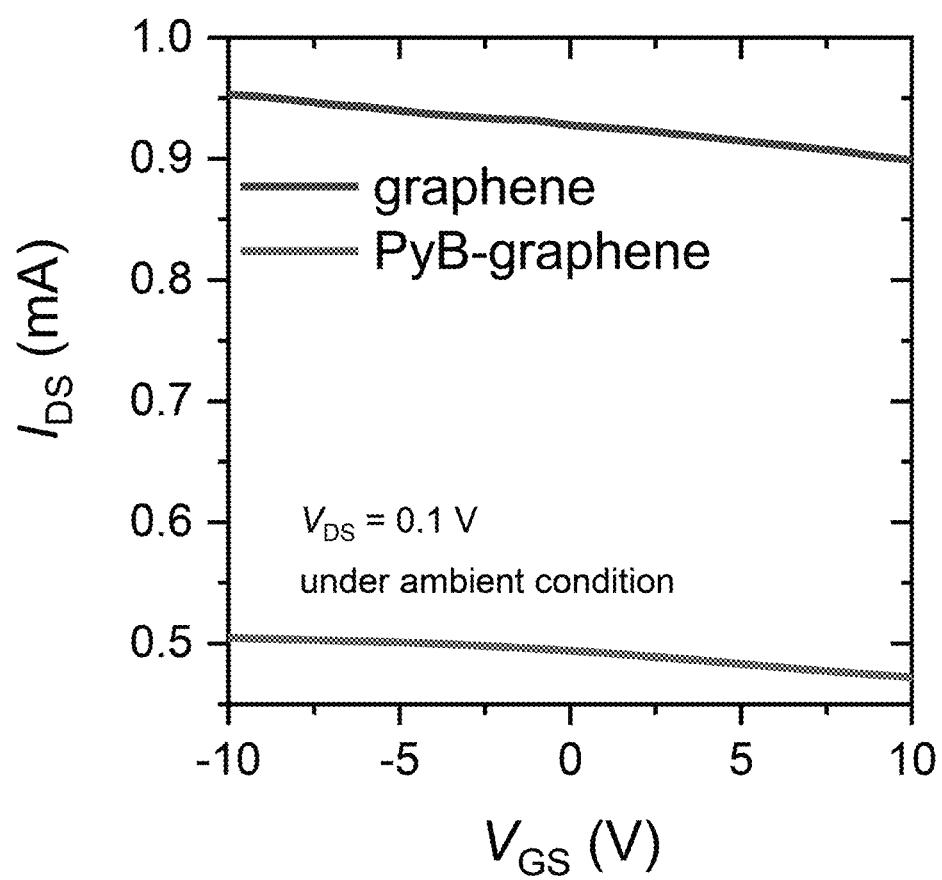
FIG. 11 represents a transfer curve of a single pixel photodetector using a PyB-doped graphene (red line) and a pristine graphene (black line) at applied $V_{GS}$ ranging from −10V to 10V.
Figure 12:
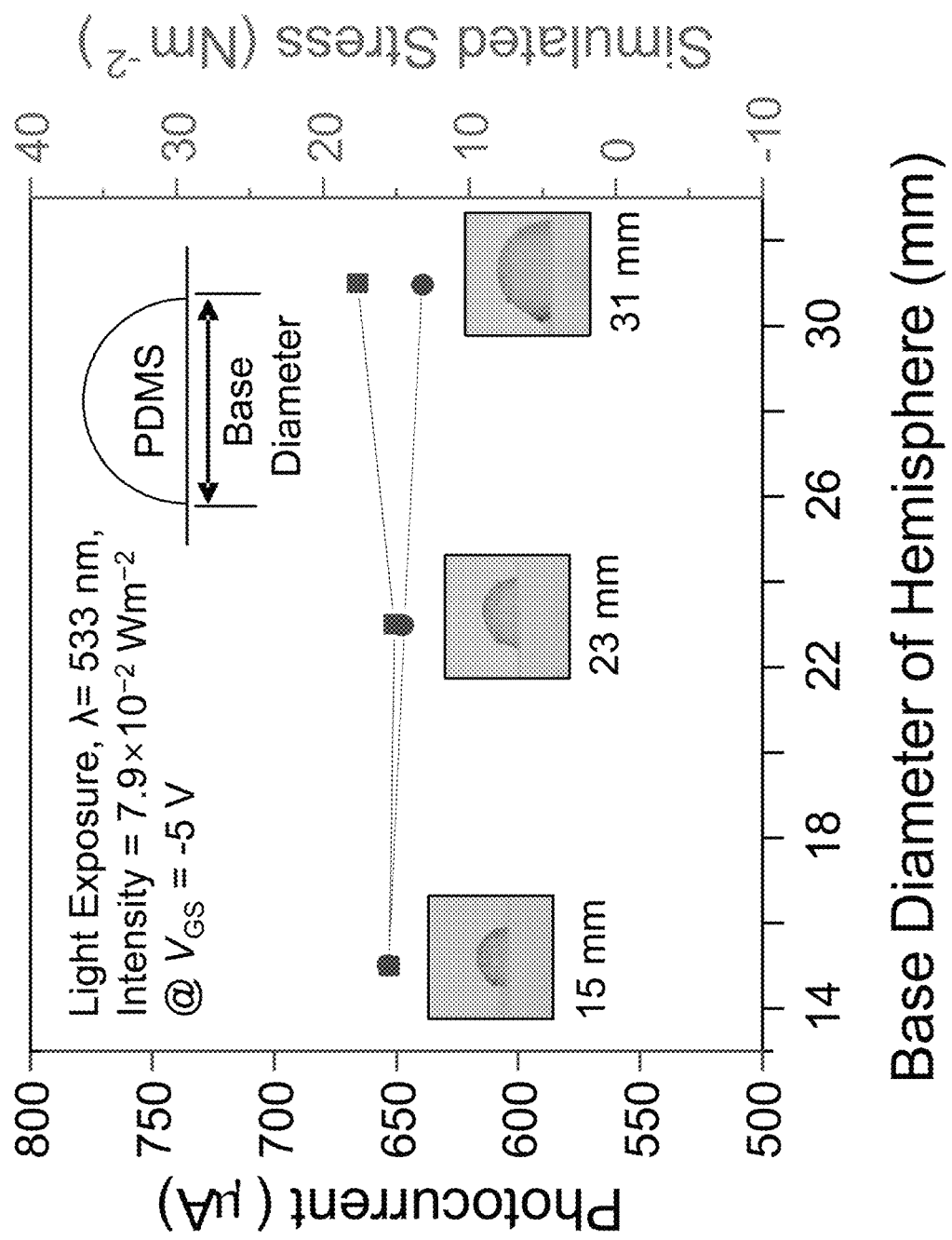
FIG. 12 represents experimental and computational (COMSOL) results showing the photocurrent (black line) and the mechanical stress (red line) for a single pixel photodetector placed on various hemispherical domes with a base diameter ranging from 15 mm to 31 mm.

FIGS. 2A and 2B present the transfer and output curves of a single pixel photodetector placed on a flat surface, respectively. The results show a typical p-type semiconductor behavior due to the presence of oxygen under ambient conditions. Charge carrier mobility (μ) and the subthreshold swing (S) were calculated using the following equations (1) and (2):

$$\mu = \left[\frac{dI_{DS}}{dV_{GS}}\right]\frac{L}{WC_{ox}V_{DS}} \quad (1)$$

$$S = \frac{dV_{GS}}{d(\log_{10} I_{DS})} \quad (2)$$

where $I_{DS}$ and $V_{GS}$ are source-drain current and source-gate voltage, respectively; $dI_{DS}/dV_{GS}$ is the transconductance ($g_m$) of the transfer characteristic; L and W are the length and width of the channel, respectively; and $C_{ox}$ is the dielectric capacitance. The transfer curves shown in FIG. 11 indicate that the $I_{DS}$ of the photodetector decreased after the doping of PyB due to the energy transfer caused by strong π-π interactions at the interface. FIG. 2C shows the corresponding transfer curves under the ambient conditions with a light wavelength ranging from 440 nm to 700 nm. The relatively low operation voltage (from −10 V to +10 V) were attributed to the high k of the atomic layer deposition (ALD)-deposited $Al_2O_3$. The drain currents (at $V_{GS}$=0.1 V) depend on the light wavelength. The ratio (P) of photocurrent ($I_{photo}$) to dark current ($I_{dark}$) and the photoresponsivity (R), which are the key parameters of the photodetector, were calculated using the following equations (3), (4), and (5):

$$I_{photo} = I_{light} - I_{dark} \quad (3)$$

$$P = \frac{I_{photo}}{I_{dark}} \quad (4)$$

$$R = \frac{I_{light} - I_{dark}}{P_{inc}A_{channel}} \quad (5)$$

where $I_{light}$ and $I_{dark}$ are the drain current under illumination and in dark, respectively; $P_{inc}$ is the intensity of incident light; and $A_{channel}$ is the channel area. The plot of R vs $V_{GS}$ is shown in FIG. 2D. The photodetector showed substantially high photoresponsivity of greater than 4000 $AW^{-1}$, which was mainly attributed to the high charge carrier mobility of the graphene (about 1602±10 $cm^2V^{-1}S^{-1}$). FIG. 2E presents the absorption spectrum of the PyB (black line) and the corresponding photocurrent (blue dots) with respect to light wavelengths ranging from 440 nm to 700 nm. The results clearly show that the photoresponse was followed well by the absorption spectrum due to the photocatalytic effect of the PyB which is visible-light-driven photoredox transformations. It is also noted that these organic PyB dye-sensitized (n-type doped) graphene hybrid composites provided high hole currents due to the effective gating behavior of the accumulated photo-excited electrons at the interface where the strong π-π interactions occur. As expected, the drain current ($I_{DS}$) increased with an increased mole concentration of the PyB from 1 μM to 1 mM in the graphene hybrid composites (FIG. 2F). FIGS. 2G and 2H confirm that the photodetectors were capable of providing repeatable and stable operation upon switching on ($\tau_{rise}$=0.17 s) and off ($\tau_{decay}$=0.32 s) under light illumination (λ=533 nm; light intensity=14 $Wm^{-2}$). Throughout these characterizations, the experimental and computational results were in agreement. Importantly, the photocurrent of the device remained nearly unchanged at 653-666 μA with the applied $V_{GS}$ of −5 V under light illumination (λ=533 nm; light intensity=7.9×10⁻² $Wm^{-2}$) when interfaced with various hemispherical domes with a base diameter ranging from 15 mm to 31 mm (FIG. 12). These results also confirm that the fractal structure can effectively accommodate mechanical deformations during its integration across a hemispherical surface in a manner that allowed the three-dimensional electronic device to experience low strains.

Figure 3D:
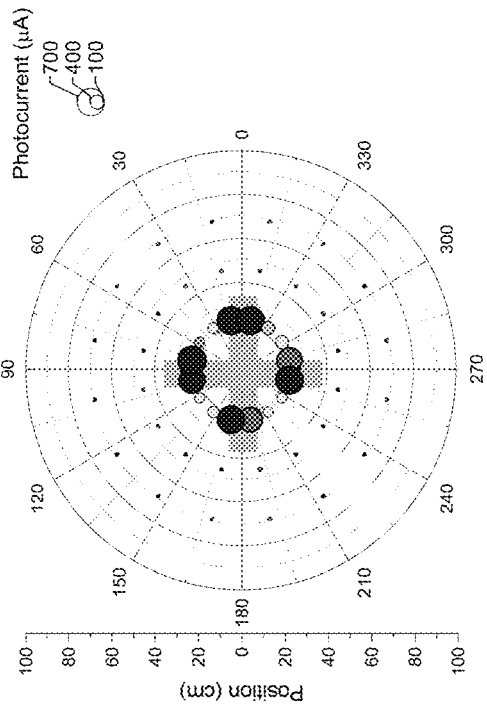
Figure 3F:
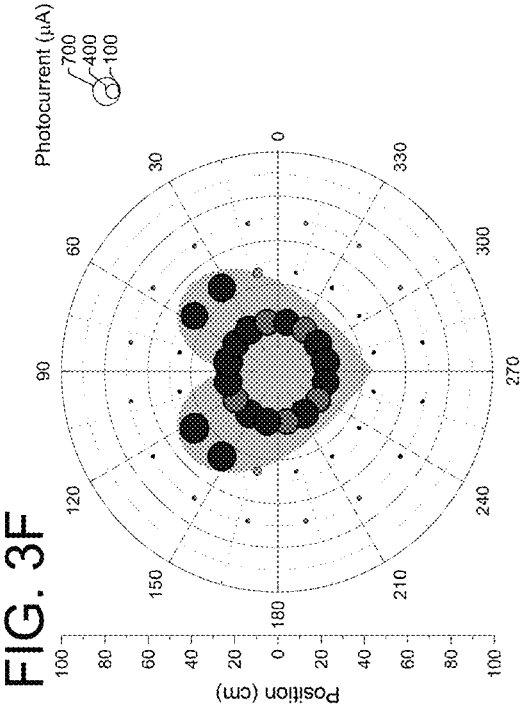
Figure 3C:
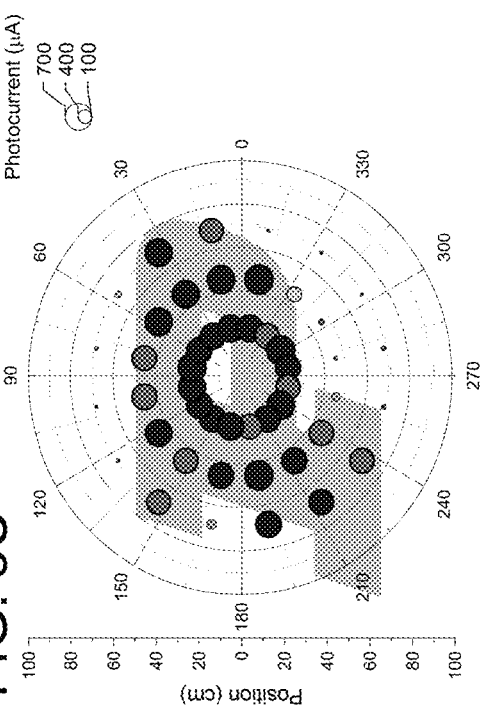
Figure 3E:
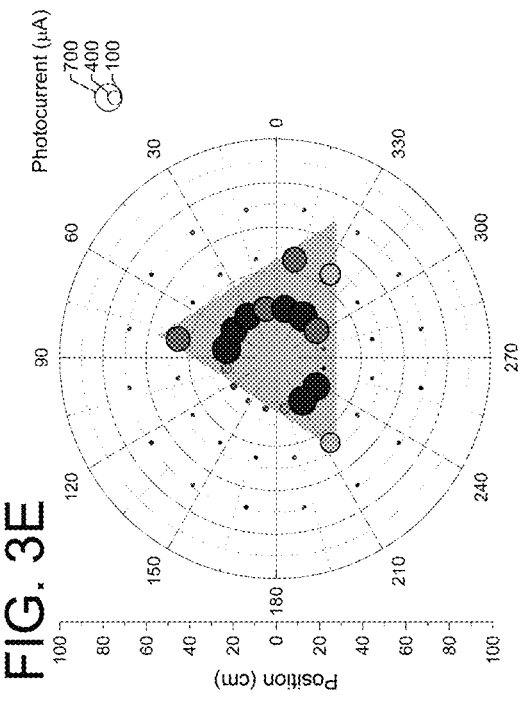
Figure 13:
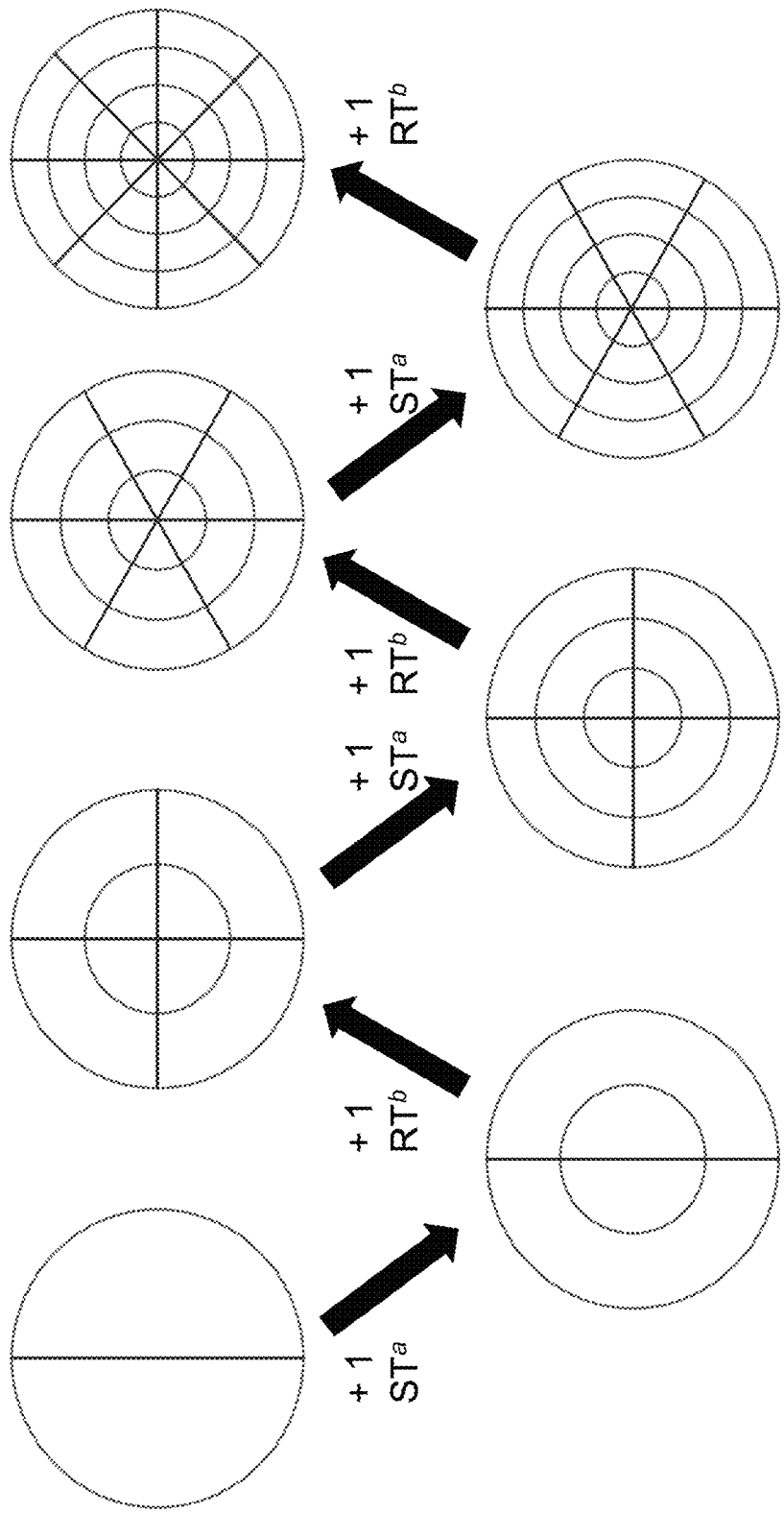
FIG. 13 includes a schematic illustration for a relationship between the number of threads and spatial resolution (i.e., the total number of photodetector pixels) of a photodetector array device.

FIG. 3A shows a measurement setup for the three-dimensional electronic device. This setup contained a parameter analyzer (Keithley 4200A-SCS), optical fibers (Single-Mode Optical Fiber Jumper Code, Duplex), light sources, a stencil shadow mask, and an optical microscope. During measurements, the device was placed on a flat surface while the direction of incident light was adjusted using the optical fibers at the fixed wavelength and light intensity of 533 nm and 7.9×10⁻² $Wm^{-2}$, respectively. A stencil shadow mask with a pre-defined pattern, such as a letter of "P" (FIG. 3B), was used to define the shape of the illuminated area. FIGS. 3C-3F show the results of photocurrent mapping for representative cases at the applied $V_{GS}$ of −5 V using different stencil shadow masks patterned to form a "P," cross, triangle, and heart symbol, respectively. The average photocurrent and dark current over the illuminated area were 669.1±4.6 μA and 96.05±3.5 μA, respectively. It is noted that the relatively high dark current typically occurred due to the zero-bandgap nature of graphene. These results were consistent with those obtained from a control photodetector array device that was fabricated directly on a Si wafer using conventional microfabrication processes. The spatial resolution of the photodetector array devices can be further improved by increasing the number of spiral or/and radial threads while maintaining the overall size of the device. FIG. 13 schematically illustrates a relationship between the number of threads and the spatial resolution (in turn, the total number of photodetector pixels).

Figure 4A:
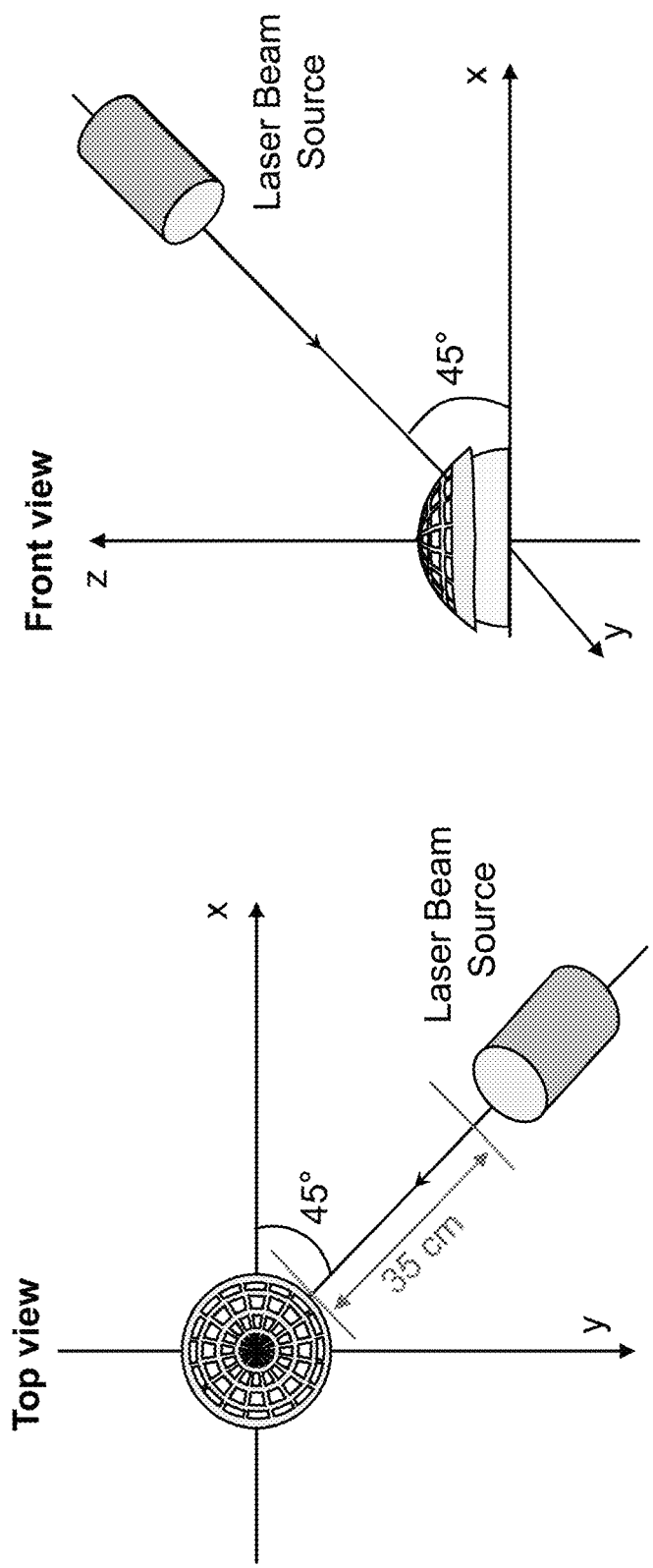
Figure 14:
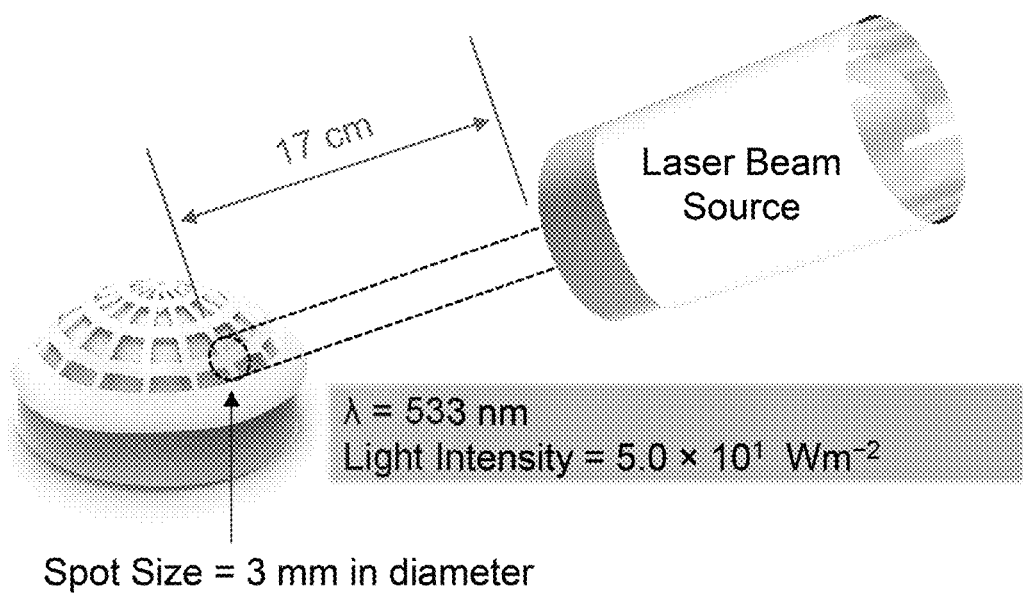
FIG. 14 is a schematic illustration for the setup of a laser beam source with an increased light intensity of $5.0 \times 10^1$ $Wm^{-2}$ (top panel) and the corresponding results of photocurrent mapping (bottom panel).
Figure 14:
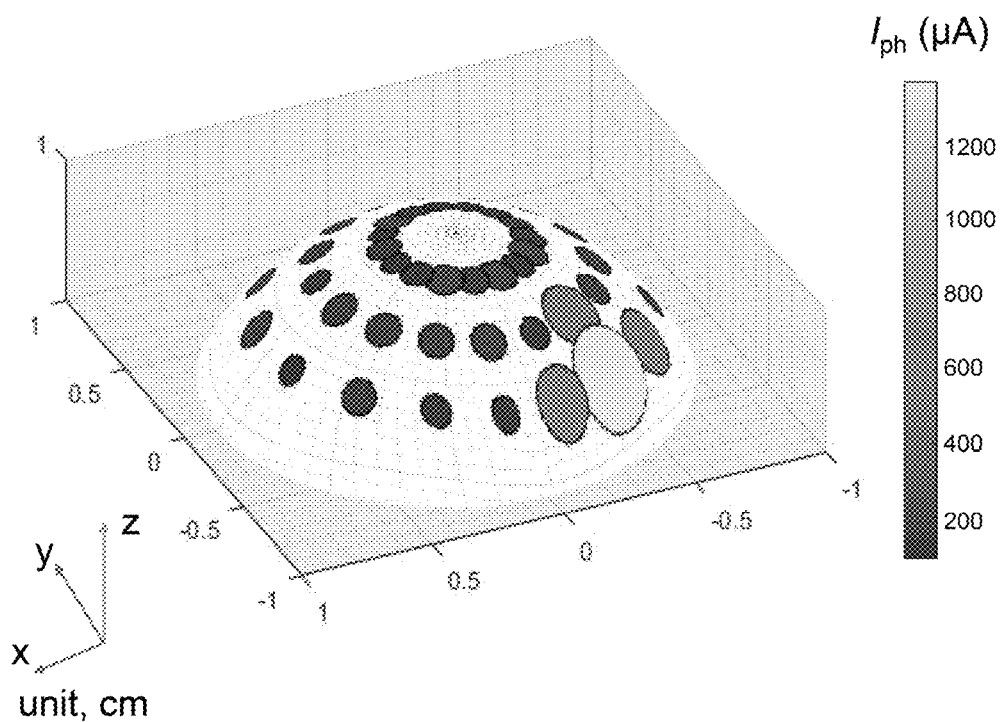

The three-dimensional electronic device was optically semi-transparent (about 93% at 533 nm) due to the thin thickness (1.5 μm-thick) and wide-open meshes of the fractal structures where light can pass through. Consequently, the device produces two sensing locations at the entry and exit sites with an incident light, enabling simultaneous detection of its direction and intensity. FIG. 4A schematically illustrates the arrangement of a laser beam source for a photodetector array device placed on a transparent hemispherical dome (base diameter=23 mm). Both the azimuthal angle in the x-y plane and the polar angle between the x-y plane and z-direction were fixed at 45° with the distance to the laser beam source (533 nm; $1.4 \times 10^1$ $Wm^{-2}$) of 35 cm. FIG. 4B shows a representative photograph (left column) and photocurrent mapping results (right column) when the whole area of the device was illuminated. A total of 48-pixel photodetectors responded without failure where the average photocurrent and dark current over the illuminated area were 591.1±5.5 μA and 120.4±9.4 μA, respectively. The photoresponsiveness was stronger on the illuminated side than on the other side due simply to partial reflection and absorption of light by the device. FIGS. 4C and 4D show the corresponding results by focusing the laser beam onto a specific area of the device with the spot size of approximately 10 mm and 3 mm in diameter, respectively. The results show that the degree of accuracy in determining the position of the laser beam was increased with a decreased spot size. The maximum photocurrents for both cases were about 600 μA, which were increased to higher than 1200 μA at the center of the illuminated area when the light intensity was increased to $5.0 \times 10^1$ $Wm^{-2}$ (FIG. 14).

These investigations demonstrated the system-level integration of a fractal structure into a three-dimensional electronic device that incorporates an organic n-type doped graphene, thereby offering several important features, including (1) desired structural robustness with high threshold strains to avoid damage during its integration across various hemispherical surfaces; (2) advanced optoelectronic functionality in detecting both direction and intensity of incident light; and (3) mechanical resilience to arguably large stress (up to 150 MPa) that allows the device to be attached and detached to/from planar or non-planar surfaces in a repetitive manner. In addition, the use of a PyB-doped graphene showed a viable possibility, as a substitute of Si, for a flexible and effective photoactive component with enhanced photoresponsivity (greater than 1000 $AW^{-1}$). The deterministic assembly process disclosed herein enabled deploying 2D deformable functional materials in 3D device architectures, which is believed to be applicable to the field of 3D electronic and optoelectronic devices, including but not limited to smart soft contact lenses.

While the invention has been described in terms of specific or particular embodiments and investigations, it should be apparent that alternatives could be adopted by one skilled in the art. For example, the three-dimensional electronic devices and their components could differ in appearance and construction from the embodiments described herein and shown in the drawings, functions of certain components of the device could be performed by components of different construction but capable of a similar (though not necessarily equivalent) function, process parameters such as temperatures and durations could be modified, and various materials could be used in the fabrication of the device and/or its components. Accordingly, it should be understood that the invention is not necessarily limited to any embodiment described herein or illustrated in the drawings. It should also be understood that the phraseology and terminology employed above are for the purpose of describing the disclosed embodiments and investigations, and do not necessarily serve as limitations to the scope of the invention. Therefore, the scope of the invention is to be limited only by the claims.

The invention claimed is:

1. A three-dimensional electronic device comprising a fractal structure having an array with a plurality of radial members interconnected at and radially extending from a center of the device, and spiral members each encircling the center and any spiral members located radially inward therefrom, wherein the fractal structure includes an organic, n-type doped graphene hybrid composite material at cross-junctions of the spiral and radial members.

2. The three-dimensional electronic device of claim 1, wherein the fractal structure is applied to a three-dimensional surface, a time-dynamic surface, or a flexible surface.

3. The three-dimensional electronic device of claim 1, wherein the three-dimensional electronic device is an electronic contact lens device.

4. The three-dimensional electronic device of claim 1, wherein the three-dimensional electronic device is a hemispherical photodetector device configured for three-dimensional photodetection, the hemispherical photodetector device having photodetectors at cross-junctions of the spiral and radial members.

5. An electronic contact lens device comprising a fractal structure having an array with a plurality of radial members interconnected at and radially extending from a center of the lens, spiral members each encircling the center and any spiral members located radially inward therefrom, and photodetectors at cross-junctions of the spiral and radial members, wherein the photodetectors comprise an organic, n-type doped graphene layer.

6. The electronic contact lens device of claim 5, wherein the n-type doped graphene layer comprises Pyronin B as an n-type dopant.

7. The electronic contact lens device of claim 6, wherein the n-type dopant has a doping concentration in a range of 1 μM to 1 mM in the n-type doped graphene layer.

8. The electronic contact lens device of claim 5, wherein the fractal structure is applied to a three-dimensional surface.

9. The electronic contact lens device of claim 8, wherein the three-dimensional surface is a surface of a transparent hemispherical dome.

\* \* \* \* \*